US012660710B2

(12) United States Patent
Gao et al.

(10) Patent No.: US 12,660,710 B2
(45) Date of Patent: Jun. 16, 2026

(54) CHIP STACKING STRUCTURE AND MANUFACTURING METHOD THEREOF, CHIP PACKAGE STRUCTURE, AND ELECTRONIC DEVICE

(71) Applicant: HUAWEI TECHNOLOGIES CO., LTD., Shenzhen (CN)

(72) Inventors: Shan Gao, Shenzhen (CN); Jifeng Zhu, Shanghai (CN); Dian Lei, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 393 days.

(21) Appl. No.: 18/341,880

(22) Filed: Jun. 27, 2023

(65) Prior Publication Data

US 2023/0361082 A1    Nov. 9, 2023

Related U.S. Application Data

(63) Continuation of application No. PCT/CN2020/140360, filed on Dec. 28, 2020.

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 90/20* (2026.01);
(Continued)

(58) Field of Classification Search
CPC ............. H01L 25/0657; H01L 25/0652; H01L 25/043; H01L 25/071; H01L 25/074;
(Continued)

(56) References Cited

U.S. PATENT DOCUMENTS

| | | | |
|---|---|---|---|
| 8,106,504 B2 * | 1/2012 | Yang ...................... | H01L 23/481 |
| | | | 257/692 |
| 8,487,444 B2 * | 7/2013 | Law .................. | H01L 21/76898 |
| | | | 257/777 |

(Continued)

FOREIGN PATENT DOCUMENTS

| | | |
|---|---|---|
| CN | 102024782 A | 4/2011 |
| CN | 202394958 U | 8/2012 |

OTHER PUBLICATIONS

International Search Report dated Sep. 28, 2021, issued for International Application No. PCT/CN2020/140360 (9 pages).

*Primary Examiner* — Wael M Fahmy
*Assistant Examiner* — Quinton A Brasfield

(57) ABSTRACT

A chip stacking structure includes a plurality of chips that are sequentially stacked and a first redistribution layer arranged on an active side of each chip. The plurality of chips include a first chip and a second chip that are located on an outermost side. Passive sides of the first chip and the second chip both face an outer side, and the chip stacking structure further includes a second redistribution layer arranged on the passive side of the first chip or the second chip. The second redistribution layer is electrically connected to at least one first redistribution layer through a first via hole.

20 Claims, 19 Drawing Sheets

(51) Int. Cl.
H10W 72/00 (2026.01)
H10W 90/20 (2026.01)
*H10W 20/00* (2026.01)

(52) U.S. Cl.
CPC ...... *H10W 20/023* (2026.01); *H10W 20/0253*
(2026.01); *H10W 72/877* (2026.01); *H10W
90/297* (2026.01); *H10W 90/722* (2026.01);
*H10W 90/732* (2026.01)

(58) Field of Classification Search
CPC .. H01L 25/0756; H01L 25/112; H01L 25/117;
H01L 2224/08145; H01L 27/0688; H01L
2224/023–024; H01L 23/49822; H01L
23/5383; H01L 23/49827; H01L 23/5384;
H01L 23/481; H01L 2224/08165; H01L
2224/16165; H01L 2224/16235; H01L
2224/32165; H01L 2224/32235; H01L
2224/40165; H01L 2224/40235; H01L
2224/48165; H01L 2224/48235; H01L
2225/06541–06544; H01L 2225/06548;
H01L 21/76898; H01L 21/486; H01L
2224/2969; H01L 2224/2919; H01L
2224/8385–8389; H10W 90/20–297;
H10W 90/701–798; H10W 70/00–098;
H10W 70/60; H10W 70/654–656; H10W
70/6565; H10W 20/20–233; H10W
20/021–0265; H10W 20/0253; H10W
70/63–635
See application file for complete search history.

(56) References Cited

U.S. PATENT DOCUMENTS

| | | | |
|---|---|---|---|
| 2009/0014891 A1* | 1/2009 | Chang | H01L 21/76898 |
| | | | 257/E23.068 |
| 2013/0093091 A1* | 4/2013 | Ma | H01L 25/0657 |
| | | | 257/751 |
| 2013/0260510 A1 | 10/2013 | Theuss | |
| 2013/0292842 A1* | 11/2013 | Kim | H01L 23/3114 |
| | | | 257/774 |
| 2017/0053882 A1* | 2/2017 | Jin | H10W 70/685 |

* cited by examiner

01

10

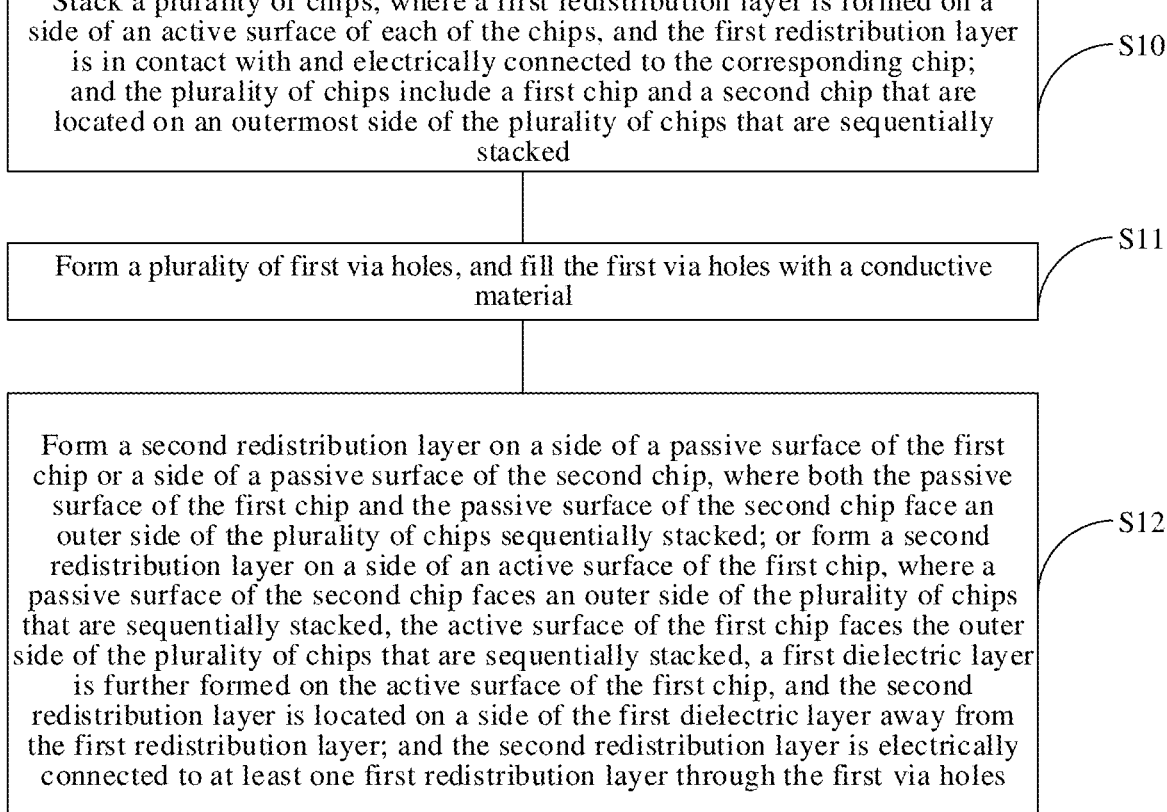

Stack a plurality of chips, where a first redistribution layer is formed on a side of an active surface of each of the chips, and the first redistribution layer is in contact with and electrically connected to the corresponding chip; and the plurality of chips include a first chip and a second chip that are located on an outermost side of the plurality of chips that are sequentially stacked — S10

Form a plurality of first via holes, and fill the first via holes with a conductive material — S11

Form a second redistribution layer on a side of a passive surface of the first chip or a side of a passive surface of the second chip, where both the passive surface of the first chip and the passive surface of the second chip face an outer side of the plurality of chips sequentially stacked; or form a second redistribution layer on a side of an active surface of the first chip, where a passive surface of the second chip faces an outer side of the plurality of chips that are sequentially stacked, the active surface of the first chip faces the outer side of the plurality of chips that are sequentially stacked, a first dielectric layer is further formed on the active surface of the first chip, and the second redistribution layer is located on a side of the first dielectric layer away from the first redistribution layer; and the second redistribution layer is electrically connected to at least one first redistribution layer through the first via holes — S12

FIG. 6

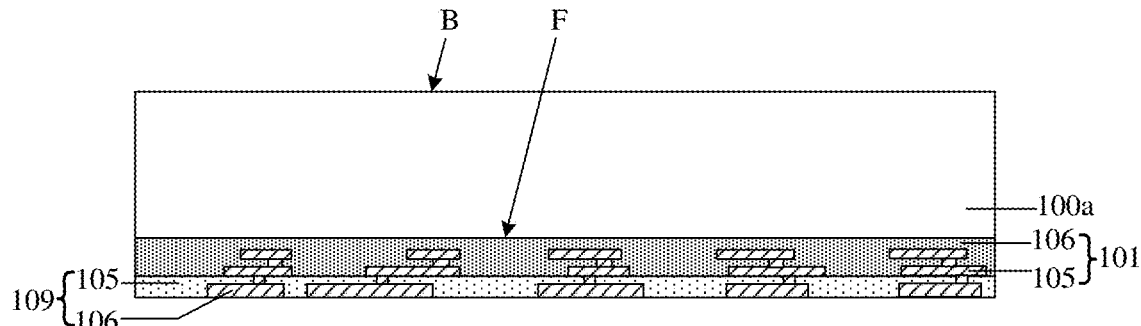
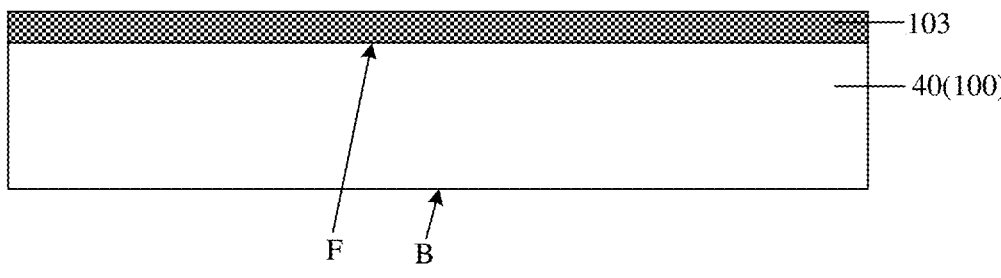
FIG. 15

CHIP STACKING STRUCTURE AND MANUFACTURING METHOD THEREOF, CHIP PACKAGE STRUCTURE, AND ELECTRONIC DEVICE

CROSS-REFERENCE TO RELATED APPLICATIONS

This application is a continuation of International Application No. PCT/CN2020/140360, filed on Dec. 28, 2020, the disclosure of which is hereby incorporated by reference in its entirety.

TECHNICAL FIELD

This disclosure relates to the field of chip technologies, and in particular, to a chip stacking structure and a manufacturing method thereof, a chip package structure, and an electronic device.

BACKGROUND

With the rapid development of semiconductor technologies, a conventional method for improving chip performance by reducing a channel size of a two-dimensional (2D) transistor has encountered some problems, for example, reduced mobility, and short-channel effects. Currently, transition from two-dimensional to three-dimensional (3D) chip manufacturing provides a new direction for improving chip performance.

By using a 3D chip (also referred to as a 3D IC) stacking technology, a plurality of chips can be integrated, to improve chip performance, reduce power consumption, reduce production costs, reduce a package size, shorten a processing cycle, and significantly improve chip integration. The 3D chip stacking technology has been successfully applied by many semiconductor manufacturers to produce a CMOS (complementary metal oxide semiconductor) image sensor, a NAND flash, a high bandwidth memory (HBM), and the like, and greatly improves product performance.

Currently, the 3D chip stacking technology includes three types, namely, die-to-die bonding (D2D bonding), die-to-wafer bonding (D2 W bonding), and wafer-to-wafer bonding (W2 W bonding). However, regardless of whether D2D bonding, D2 W bonding, or W2 W bonding is used to manufacture a chip stacking structure, a via hole needs to be formed on a former chip before a latter chip (where the chip may be, for example, a die or a wafer) is stacked, and the latter chip is electrically connected to the former chip through the via hole. In this case, via hole forming need to be performed for a plurality times, so that chips can be electrically connected to an external circuit (for example, a package substrate). Consequently, a process of manufacturing the chip stacking structure is complex, production costs of manufacturing the chip stacking structure are increased, and production efficiency is reduced.

SUMMARY

Embodiments of this disclosure provide a chip stacking structure and a manufacturing method thereof, a chip package structure, and an electronic device, to reduce production costs of manufacturing the chip stacking structure, and improve production efficiency.

To achieve the foregoing objectives, the following technical solutions are adopted in this disclosure.

According to a first aspect, a chip stacking structure is provided. The chip stacking structure includes a plurality of chips that are sequentially stacked and a first redistribution layer arranged on an active side of each chip. The first redistribution layer is in contact with and electrically connected to a corresponding chip. The plurality of chips include a first chip and a second chip that are located on an outermost side of the chip stacking structure. Both a passive side of the first chip and a passive side of the second chip face an outer side of the chip stacking structure, and the chip stacking structure further includes: a second redistribution layer arranged on a side of the passive side of the first chip or a side of the passive side of the second chip. Alternatively, a passive side of the second chip faces an outer side of the chip stacking structure, an active side of the first chip faces the outer side of the chip stacking structure, and the chip stacking structure further includes: a first dielectric layer and a second redistribution layer arranged on the active side of the first chip, where the first dielectric layer is located between the first redistribution layer and the second redistribution layer, and the second redistribution layer is electrically connected to at least one first redistribution layer through a first via hole. Because in the conventional technology, a via hole needs to be formed on a former chip before a latter chip is stacked, and the latter chip is electrically connected to the former chip through the via hole. In this case, via holes need to be formed for a plurality of times, so that the chips can be electrically connected to an external circuit (for example, a package substrate). As a result, the process of manufacturing the chip stacking structure is complex. However, in embodiments of this disclosure, because the second redistribution layer is electrically connected to at least one first redistribution layer through the first via hole, and each first redistribution layer is electrically connected to a corresponding chip, at least one chip may be electrically connected to the second redistribution layer through a first via hole. The second redistribution layer is configured to be electrically connected to the external circuit, so that the chip is electrically connected to the external circuit. Each first via hole may be formed by using a one-time drilling process, so that a process of manufacturing the chip stacking structure is simplified, production costs are saved, and production efficiency is improved.

Based on the above, in embodiments of this disclosure, when the chip stacking structure is manufactured, and chips in the chip stacking structure are dies, a plurality of wafers may be sequentially stacked, and then the plurality of wafers are cut to form the chip stacking structure. Compared with a die-to-die bonding technique and a die-to-wafer bonding technique in the conventional technology in which wafers are first cut, and then dies are stacked, because impurity contamination is caused during cutting of the wafers, the dies need to be cleaned before the dies are stacked. However, in embodiments of this disclosure, when the chip stacking structure is manufactured, a plurality of wafers may be sequentially stacked together, and then the plurality of wafers are cut. A process of cleaning a chip stacking structure obtained after cutting (where a chip is a die in this case) is much less complex than a cleaning process before the dies are stacked. In addition, compared with the die-to-die bonding technique and the die-to-wafer bonding technique in the conventional technology in which die-to-die alignment or die-to-wafer alignment needs to be performed on each die, because in embodiments of this disclosure, a wafer-to-wafer alignment operation only needs to be performed once during wafer-to-wafer stacking, to achieve alignment between a plurality of dies, thereby improving production efficiency and reducing production costs. Based on this, in embodiments of this disclosure, when the chip stacking structure is manufactured, a plurality of wafers may be directly stacked in sequence. Therefore, compared with the die-to-die bonding technique and the die-to-wafer bonding technique in the conventional technology, in this disclosure, there is no need to check dies one by one, which can improve production efficiency and reduce production costs. Based on this, compared with the conventional technology, in embodiments of this disclosure, when the chip stacking structure is manufactured, a plurality of wafers are first stacked together, which simplifies a process and saves production costs.

In a possible implementation, the second redistribution layer is located on the side of the passive side of the first chip or the side of the passive side of the second chip. The plurality of chips further include a third chip arranged between the first chip and the second chip. The active side of the first chip is opposite to the active side of the third chip, and an active side of the second chip faces a passive side of the third chip. The chip stacking structure further includes a second dielectric layer arranged between the active side of the first chip and the active side of the third chip. When the plurality of chips are stacked in such a stacking manner, because the active side of the first chip is opposite to the active side of the third chip, the passive side of the first chip faces the outer side of the chip stacking structure. In addition, because the active side of the second chip faces the passive side of the third chip, the passive side of the second chip faces the outer side of the chip stacking structure. In this way, in the stacking structure, both the passive sides of the first chip and the second chip face the outer side of the chip stacking structure. Therefore, the second redistribution layer may be formed on the side of the passive side of the first chip or the side of the passive side of the second chip.

In a possible implementation, the second redistribution layer is located on the active side of the first chip, and the active side of the second chip faces the passive side of the first chip. When the plurality of chips are stacked in such a stacking manner, because the active side of the second chip faces the passive side of the first chip, for two chips located on the outermost side, namely, the first chip and the second chip, the active side of the first chip faces the outer side of the chip stacking structure, and the passive side of the second chip faces the outer side of the chip stacking structure. Therefore, the second redistribution layer may be formed on the side of the active side of the first chip.

In a possible implementation, the chip stacking structure further includes a third dielectric layer arranged between the first redistribution layer and a passive side of a chip adjacent to the first redistribution layer. Because the third dielectric layer is arranged between the first redistribution layer and a passive side of the chip adjacent to the first redistribution layer, the third dielectric layer may be first formed on a side of the passive side of the chip, and then two adjacent chips are bonded together in a fusion bonding manner.

In a possible implementation, the chip stacking structure further includes a third redistribution layer arranged on a side of the first redistribution layer away from the chip electrically connected to the first redistribution layer. The third redistribution layer is electrically connected to the first redistribution layer, and the second redistribution layer is electrically connected to the third redistribution layer through the first via hole. A thickness of a metal line layer in the third redistribution layer is greater than a thickness of a metal line layer in the first redistribution layer. Because the thickness of the metal line layer in the third redistribution layer is greater than the thickness of the metal line layer in the first redistribution layer, the second redistribution layer is electrically connected to the third redistribution layer through the first via hole. In this way, reliability of an electrical connection between the second redistribution layer and the third redistribution layer can be ensured, thereby improving reliability of an electrical connection between the second redistribution layer and the chip.

In a possible implementation, the chip stacking structure further includes a micro bump that is arranged on a side of the second redistribution layer away from the chip and that is electrically connected to the second redistribution layer. The first redistribution layer is electrically connected to the chip, the second redistribution layer is electrically connected to at least one first redistribution layer, and the second redistribution layer is electrically connected to the micro bump, so that the micro bump can be electrically connected to at least one chip. The micro bump is configured to be electrically connected to the package substrate, so that the chip can be electrically connected to the package substrate. In addition, when any two chips in the chip stacking structure need to be electrically connected, a connection between the any two chips may be implemented by connecting micro bumps, to implement communication between the any two chips.

In a possible implementation, the chip stacking structure further includes a second via hole, and any two first redistribution layers are electrically connected through the second via hole. Any two first redistribution layers are electrically connected through the second via hole, and therefore, any two chips can be electrically connected through the second via hole, to implement communication between the any two chips. Compared with the conventional technology in which a plurality of via hole needs to be used to implement an electrical connection between two non-adjacent chips, a process of manufacturing the chip stacking structure is complex. However, in this embodiment of this disclosure, two non-adjacent chips may be electrically connected through the second via hole, and one second via hole may be manufactured by using a one-time drilling process, which can simplify the process of manufacturing the chip stacking structure.

In a possible implementation, the chip stacking structure further includes a package substrate. The second redistribution layer is electrically connected to the package substrate. Because the second redistribution layer is electrically connected to the first redistribution layer through at least one first via hole, and the first redistribution layer is in contact with and electrically connected to a corresponding chip, at least one chip can be electrically connected to the package substrate.

According to a second aspect, a chip package structure is provided. The chip package structure includes a package substrate and the chip stacking structure. The second redistribution layer in the chip stacking structure is electrically connected to the package substrate. Because the chip package structure has a same technical effect as that of the foregoing embodiments, details are not described herein again.

According to a third aspect, an electronic device is provided. The electronic device includes a printed circuit board and the foregoing chip stacking structure. The chip stacking structure is electrically connected to the printed circuit board. Because the electronic device has a same technical effect as that of the foregoing embodiments, details are not described herein again.

According to a fourth aspect, a chip stacking structure manufacturing method is provided. The manufacturing method includes the following steps. First, a plurality of chips are sequentially stacked, where a first redistribution layer is formed on a side of an active side of each chip, and the first redistribution layer is in contact with and electrically connected to a corresponding chip; and the plurality of chips include a first chip and a second chip that are located on an outermost side of the plurality of chips that are sequentially stacked. Then, a plurality of first via holes are formed, and the first via holes are filled with a conductive material. Next, a second redistribution layer is formed on a side of a passive side of the first chip or a side of a passive side of the second chip, where both the passive side of the first chip and the passive side of the second chip face an outer side of the plurality of chips that are sequentially stacked. Alternatively, a second redistribution layer is formed on the side of the active side of the first chip, where a passive side of the second chip faces an outer side of the plurality of chips that are sequentially stacked, the active side of the first chip faces the outer side of the plurality of chips that are sequentially stacked, a first dielectric layer is further formed on the active side of the first chip, and the second redistribution layer is located on a side of the first dielectric layer away from the first redistribution layer; and the second redistribution layer is electrically connected to at least one first redistribution layer through the first via hole. Compared with the conventional technology, a plurality of via holes need to be manufactured to implement an electrical connection between chips and the outside. In embodiments of this disclosure, in a process of manufacturing the chip stacking structure, after a plurality of chips are stacked together, each first via hole is manufactured by one-time drilling. The first redistribution layer electrically connected to the chip is electrically connected to the second redistribution layer through the first via hole, that is, at least one chip is electrically connected to the second redistribution layer through the first via hole, and the second redistribution layer is electrically connected to an external circuit, to implement an electrical connection between the chips and the external circuit. Therefore, embodiments of this disclosure help simplify the process of manufacturing the chip stacking structure, save production costs, and improve production efficiency.

Based on this, compared with the die-to-die bonding technique and the die-to-wafer bonding technique in the conventional technology in which wafers are first cut, and then dies are stacked, because impurity contamination is caused during cutting of the wafers, the dies need to be cleaned before the dies are stacked. However, in embodiments of this disclosure, when the chip stacking structure is manufactured, a plurality of wafers may be sequentially stacked together, and then the plurality of wafers are cut. A process of cleaning a chip stacking structure obtained after cutting (where a chip is a die in this case) is much less complex than a cleaning process before the dies are stacked. In addition, compared with the die-to-die bonding technique and the die-to-wafer bonding technique in the conventional technology in which die-to-die alignment or die-to-wafer alignment needs to be performed on each die, because in embodiments of this disclosure, a wafer-to-wafer alignment operation only needs to be performed once during wafer-to-wafer stacking, to achieve alignment between a plurality of dies, thereby improving production efficiency and reducing production costs. Based on this, in embodiments of this disclosure, when the chip stacking structure is manufactured, a plurality of wafers are directly stacked in sequence. Therefore, compared with the die-to-die bonding technique and the die-to-wafer bonding technique in the conventional technology, in this disclosure, there is no need to check dies one by one, which can improve production efficiency and reduce production costs. Based on this, compared with the conventional technology, in embodiments of this disclosure, when the chip stacking structure is manufactured, a plurality of wafers are first stacked together, which simplifies a process and saves production costs.

In a possible implementation, that a plurality of chips are sequentially stacked includes: stacking a third chip on the first chip, where the active side of the third chip faces the active side of the first chip; and a second dielectric layer is formed between the first redistribution layer of the first chip and the first redistribution layer of the third chip; and performing thinning processing on a passive side of the third chip, stacking the second chip on the passive side of the third chip, and performing thinning processing on the passive side of the first chip or the passive side of the second chip, where the active side of the second chip faces the passive side of the third chip. When the plurality of chips are stacked in such a stacking manner, both the passive side of the first chip and the passive side of the second chip face an outer side of a wafer stack structure.

In a possible implementation, thinning processing is performed on the passive side of the first chip, and the forming a second redistribution layer on a side of a passive side of the first chip or a side of a passive side of the second chip includes: forming the second redistribution layer on the side of the passive side of the first chip; or thinning processing is performed on the passive side of the second chip, and the forming a second redistribution layer on a side of a passive side of the first chip or a side of a passive side of the second chip includes: forming the second redistribution layer on the side of the passive side of the second chip. Because both the passive side of the first chip and the passive side of the second chip face the outer side of the wafer stack structure, the second redistribution layer may be formed on the side of the passive side of the first chip or the side of the passive side of the second chip.

In a possible implementation, after the forming the second redistribution layer on the side of the passive side of the first chip, the manufacturing method further includes: performing thinning processing on the passive side of the second chip. Alternatively, after the forming the second redistribution layer on the side of the passive side of the second chip, the manufacturing method further includes: performing thinning processing on the passive side of the first chip. This can reduce a thickness of the chip stacking structure.

In a possible implementation, after the forming the second redistribution layer on the side of the passive side of the first chip and before the performing thinning processing on the passive side of the second chip, or after the forming the second redistribution layer on the side of the passive side of the second chip and before the performing thinning processing on the passive side of the first chip, the manufacturing method further includes: forming a micro bump that is electrically connected to the second redistribution layer on a side of the second redistribution layer away from the chip. The first redistribution layer is electrically connected to the chip, the second redistribution layer is electrically connected to at least one first redistribution layer, and the second redistribution layer is electrically connected to the micro bump, so that the micro bump can be electrically connected to at least one chip. In addition, the micro bump is configured to be electrically connected to the package substrate, so that an electrical connection between the chip and the package substrate can be implemented. Based on this, when any two chips in the chip stacking structure need to be electrically connected, a connection between the any two chips may be implemented by connecting micro bumps, to implement communication between the any two chips.

In a possible implementation, after the performing thinning processing on a passive side of the third chip and before the stacking the second chip on the passive side of the third chip, the manufacturing method further includes: forming a third dielectric layer on a side of the passive side of the third chip. In this way, the third chip and the second chip can be electrically connected together in a fusion bonding manner.

In a possible implementation, that a plurality of chips are sequentially stacked includes: stacking the first chip on a carrier, where the first dielectric layer is formed between the carrier and the first redistribution layer of the first chip; performing thinning processing on the passive side of the first chip, and stacking the second chip on the passive side of the first chip, where the active side of the second chip faces the passive side of the first chip; and removing the carrier. When the plurality of chips are stacked in such a stacking manner, because the active side of the second chip faces the passive side of the first chip, after the carrier is removed, for two chips located on the outermost side, namely, the first chip and the second chip, the active side of the first chip faces the outer side of the chip stacking structure, and the passive side of the second chip faces the outer side of the chip stacking structure.

In a possible implementation, the carrier is a carrier wafer or a carrier substrate.

In a possible implementation, the second redistribution layer is formed on a side of the first dielectric layer away from the first chip. Because the active side of the first chip faces the outer side of the chip stacking structure, the second redistribution layer may be formed on a side of the active side of the first chip.

In a possible implementation, after the second redistribution layer is formed on the side of the first dielectric layer away from the first chip, the manufacturing method further includes: performing thinning processing on the passive side of the second chip. This can reduce a thickness of the chip stacking structure.

In a possible implementation, after the second redistribution layer is formed on the side of the first dielectric layer away from the first chip and before the performing thinning processing on the passive side of the second chip, the manufacturing method further includes: forming a micro bump that is electrically connected to the second redistribution layer on a side of the second redistribution layer away from the first dielectric layer. Because the formed micro bump has a same technical effect as that of the foregoing embodiments, details are not described herein again.

In a possible implementation, after the performing thinning processing on the passive side of the first chip and before the stacking the second chip on the passive side of the first chip, the manufacturing method further includes: forming a third dielectric layer on the side of the passive side of the first chip. Because the third dielectric layer is formed on the side of the passive side of the first chip before the second chip is stacked on the passive side of the first chip, when the second chip is stacked on the passive side of the first chip, the second chip and the first chip may be stacked together in the fusion bonding manner.

In a possible implementation, two adjacent chips are connected together in the fusion bonding manner. Two adjacent chips are connected together in the fusion bonding manner, so that organic contamination can be avoided, and a problem such as wafer warpage can be avoided when the chip is a wafer, thereby ensuring process reliability.

In a possible implementation, a third redistribution layer on a side of the first redistribution layer away from a chip electrically connected to the first redistribution layer is further formed on the active side of each chip. The third redistribution layer is electrically connected to the first redistribution layer, and the second redistribution layer is electrically connected to the third redistribution layer through the first via hole. A thickness of a metal line layer in the third redistribution layer is greater than a thickness of a metal line layer in the first redistribution layer. Because the formed third redistribution layer has a same technical effect as that of the foregoing embodiments, details are not described herein again.

In a possible implementation, at least one of the plurality of chips is a wafer. After the second redistribution layer is formed on the side of the passive side of the first chip or the side of the passive side of the second chip, or after the second redistribution layer is formed on the side of the active side of the first chip, the manufacturing method further includes: cutting the wafer, to obtain a plurality of chip stacking structures that have identical structures and identical functions.

In a possible implementation, that a plurality of chips are sequentially stacked includes: stacking an $m^{th}$ chip on an $n^{th}$ chip, and performing thinning processing on a passive side of the $m^{th}$ chip, where both m and n are positive integers; and forming a second via hole, and filling the second via hole with a conductive material, where the first redistribution layer of the $m^{th}$ chip and the first redistribution layer of the $n^{th}$ chip are electrically connected through the second via hole. In the conventional technology, when the $m^{th}$ chip and the $n^{th}$ chip are not adjacent, to implement an electrical connection between the $m^{th}$ chip and the $n^{th}$ chip, a plurality of via holes need to be formed. As a result, a process of manufacturing the chip stacking structure is complex. However, in embodiments of this disclosure, the first redistribution layer of the $m^{th}$ chip is electrically connected to the first redistribution layer of the $n^{th}$ chip through the second via hole, and one second via hole may be manufactured by using a one-time drilling process. Therefore, the process of manufacturing the chip stacking structure can be simplified.

BRIEF DESCRIPTION OF DRAWINGS

FIG. 6 is a schematic flowchart of a chip stacking structure manufacturing method according to an embodiment of this disclosure;

FIG. 15 is a schematic structural diagram 9 in a process of a chip stacking structure manufacturing method according to an embodiment of this disclosure;

REFERENCE NUMERALS

01—electronic device; 02—chip package structure; 10—chip stacking structure; 11 micro bump; 12—first metal layer; 13—controlled collapse chip connection bump; 14—second metal layer; 15—micro bump; 16—through silicon via; 17—solder ball; 20—package substrate; 30—connecting piece; 40—carrier; 100—chip; 101—first redistribution layer; 102—second redistribution layer; 103—first dielectric layer; 104—first via hole; 105—metal line layer; 106—insulation layer; 107—second dielectric layer; 108—third dielectric layer; 109—third redistribution layer; 110—memory chip; 111—logic chip; and 112—second via hole.

DESCRIPTION OF EMBODIMENTS

The technical solutions of embodiments of this disclosure are described below with reference to the accompanying drawings in embodiments of this disclosure. It is obvious that the described embodiments are merely some rather than all of embodiments of this disclosure.

The terms such as "first" and "second", below are merely for convenience of description, and are not to be construed as indicating or implying relative importance or implicitly indicating a quantity of indicated technical features. Therefore, a feature limited by "first" or "second" may explicitly or implicitly include one or more features. In description of this disclosure, unless otherwise stated, "a plurality of" means two or more than two. For example, a plurality of processing units means two or more processing units.

In embodiments of this disclosure, unless otherwise explicitly specified and limited, the term "connection" should be understood in a broad sense. For example, the "connection" may be a fixed connection, a detachable connection, or an integrated connection. Alternatively, the "connection" may be a direct connection or an indirect connection through an intermediary. Further, the term "electrical connection" may be a direct electrical connection or an indirect electrical connection through an intermediary.

In embodiments of this disclosure, the term such as "example" or "for example" is used to represent giving an example, an illustration, or a description. Any embodiment or design scheme described as "example" or "for example" in embodiments of this disclosure should not be interpreted as being more preferred or advantageous than another embodiment or design scheme. Exactly, use of the term such as "example" or "for example" is intended to present a relative concept in a specific manner.

An embodiment of this disclosure provides an electronic device. The electronic device may include a CMOS image sensor, a NAND flash, a high bandwidth memory, a mobile phone, a tablet computer (pad), a television, a smart wearable product (for example, a smart watch or a smart band), a virtual reality (VR) terminal device, an augmented reality (AR) terminal device, and other electronic products. A specific form of the electronic device is not specially limited in this embodiment of this disclosure.

Figure 1:
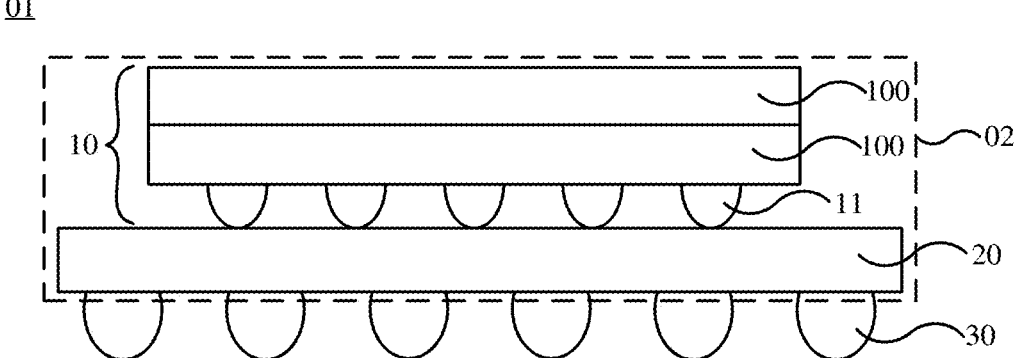
FIG. 1 is a schematic diagram of a structure of an electronic device according to an embodiment of this disclosure.

As shown in FIG. 1, the electronic device 01 may include a chip package structure 02 and a printed circuit board (PCB). The printed circuit board is not illustrated in FIG. 1. The chip package structure 02 includes a chip stacking structure 10 and a package substrate 20. The chip stacking structure 10 is electrically connected to the package substrate 20.

The chip stacking structure 10 includes a plurality of chips 100 sequentially stacked (where FIG. 1 is illustrated by using an example in which two chips 100 are included). In some embodiments, the chip stacking structure 10 may further include a micro bump (ubump) 11, and the package substrate 20 may be electrically connected to the chips 100 by using a plurality of micro bumps 11. In addition, in some embodiments, as shown in FIG. 1, the electronic device 01 may further include a connecting piece 30. The package substrate 20 in the chip package structure 02 is electrically connected to the printed circuit board by using the connecting piece 30. In this way, communication between the chip stacking structure 10 and an electronic system can be implemented. The connecting piece 30 may be a solder ball or a micro bump.

A structure of the chip stacking structure 10 is described in detail below.

Figure 2A:
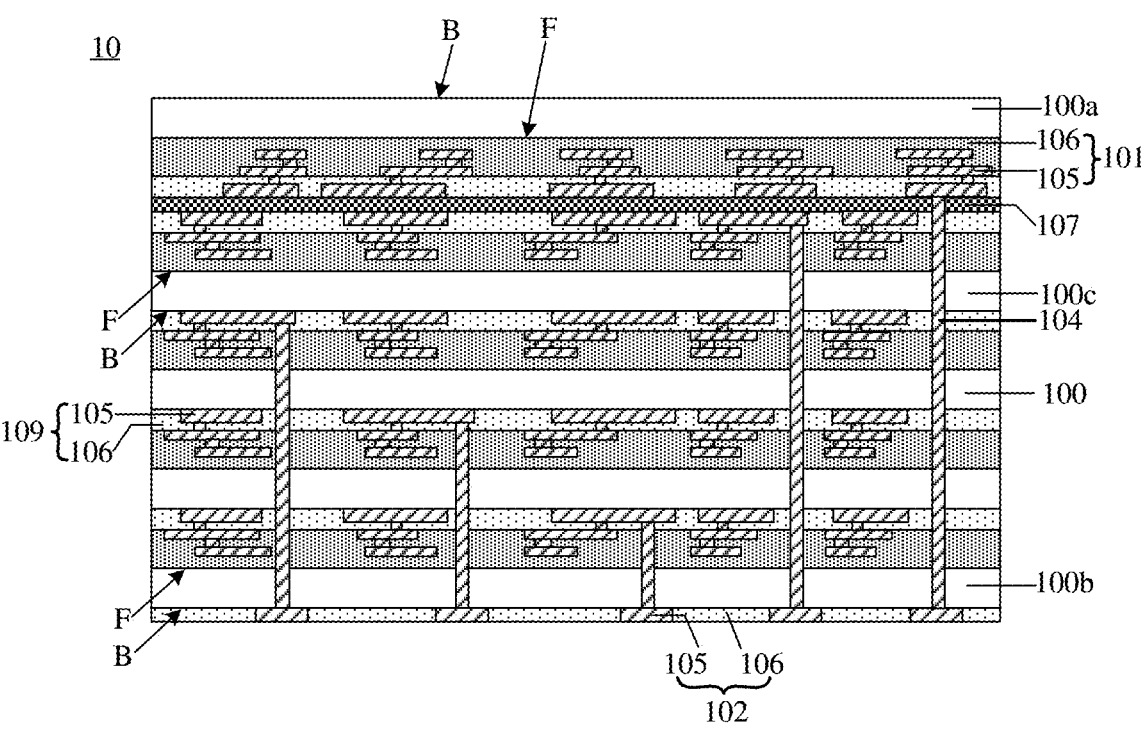
FIG. 2a is a schematic diagram of a structure of a chip stacking structure according to an embodiment of this disclosure.
Figure 2B:
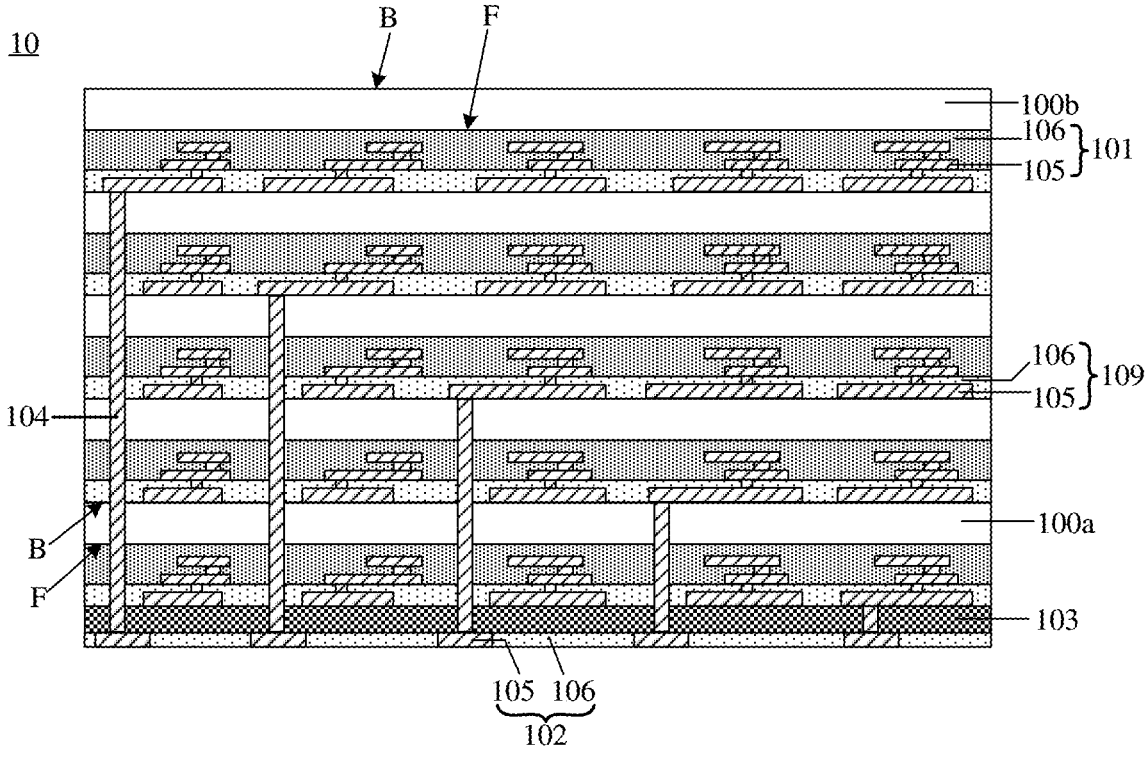
FIG. 2b is a schematic diagram of a structure of a chip stacking structure according to another embodiment of this disclosure.

As shown in FIG. 2a and FIG. 2b, the chip stacking structure 10 includes: a plurality of chips 100 sequentially stacked and a first redistribution layer (RDL) 101 arranged on an active side F of each chip 100. The first redistribution layer 101 is in contact with and electrically connected to a corresponding chip 100.

It is to be noted that, the chip 100 in embodiments of this disclosure may be a die (or may be referred to as a particle or a bare chip), or may be a wafer. It may be understood that, the wafer is cut to obtain a die. Based on this, in some embodiments, the plurality of chips 100 are dies. In some other embodiments, the plurality of chips 100 are wafers. In still other embodiments, a first chip 100a in the plurality of chips 100 is a wafer, and the other chips are dies.

In this embodiment of this disclosure, because the plurality of chips 100 in the chip stacking structure 10 are sequentially stacked, there are two chips 100 located on an outermost side of the chip stacking structure 10 in a stacking direction, that is, the plurality of chips 100 include a first chip 100a and a second chip 100b that are located on the outermost side of the chip stacking structure 10.

As shown in FIG. 2a, both a passive side B of the first chip 100a and a passive side B of the second chip 100b face an outer side of the chip stacking structure 10, and the chip stacking structure 10 further includes: a second redistribution layer 102 arranged on a side of the passive side B of the first chip 100a or a side of the passive side B of the second chip 100b. Alternatively, as shown in FIG. 2b, a passive side B of the second chip 100b faces an outer side of the chip stacking structure 10, the active side F of the first chip 100a faces the outer side of the chip stacking structure 10, and the chip stacking structure 10 further includes: a first dielectric layer 103 and a second redistribution layer 102 arranged on the active side F of the first chip 100a. The first dielectric layer 103 is located between the first redistribution layer 101 and the second redistribution layer 102. The second redistribution layer 102 is electrically connected to at least one first redistribution layer 101 through a first via hole 104.

A quantity of stacked chips 100 in the chip stacking structure 10 is not limited, and the quantity of stacked chips 100 may be set based on an application requirement. Based on this, the chip 100 may be a memory chip, a logic chip, or a chip with any other function. In addition, the plurality of chips in the chip stacking structure 10 may be chips of a same type (for example, the plurality of chips are all memory chips). Alternatively, the plurality of chips may be chips of different types (for example, the plurality of chips include a memory chip and a logic chip). In other words, the chip stacking structure 10 provided in embodiments of this disclosure may implement integration between chips of a same type or different types.

It is to be noted that, any chip in embodiments of this disclosure may include a substrate and a circuit structure arranged on the substrate. In a working process, the circuit structure enables the chip to implement a function of the chip, for example, a logical operation or data storage. A material forming the substrate of the chip may include a silicon wafer, glass, amorphous silicon (a-Si), silicon carbide (SiC), or the like. A surface on a side of the circuit structure away from the substrate in the chip may be referred to as an active side F (or a front surface F) of the chip, and a surface on a side of the substrate away from the circuit structure may be referred to as a passive side B (or a back surface B) of the chip.

The first via hole 104 may be formed by using a through silicon via (through silicon via, TSV) technology.

Figure 3:
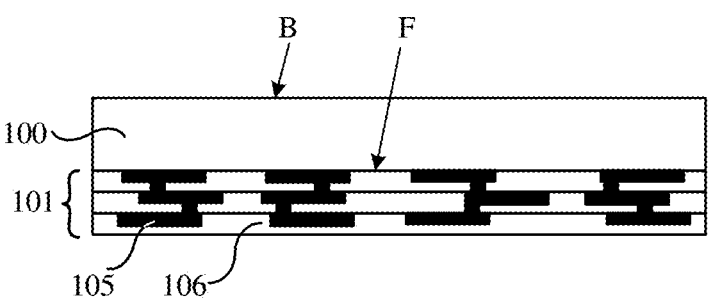
FIG. 3 is a schematic structural diagram of a chip and a first redistribution layer according to an embodiment of this disclosure.

It may be understood that, as shown in FIG. 3, the first redistribution layer 101 may include one or more metal line layers 105 and one or more insulation layers 106. When the first redistribution layer 101 includes a plurality of metal line layers 105, two adjacent metal line layers 105 in the first redistribution layer 101 are spaced apart by using an insulation layer 106. In addition, in order to electrically connect the two adjacent metal line layers 105, the first redistribution layer 101 further includes via holes provided on the insulation layer 106, and the two adjacent metal line layers 105 are electrically connected through the via holes.

For example, a material of the metal line layer 105 includes but is not limited to one material of copper, aluminum, nickel, gold, silver, and titanium, or a combination of two or more materials.

For example, a material of the insulation layer 106 includes but is not limited to one material of silicon oxide, silicon nitride, silicon oxynitride, silica gel, or polyimide, or a combination of two or more materials.

As can be learned from the above, that the first redistribution layer 101 is electrically connected to a chip 100 means that the metal line layer 105 in the first redistribution layer 101 is electrically connected to the circuit structure of the active side F of the chip 100.

In addition, the second redistribution layer 102 may also include one or more metal line layers 105 and one or more insulation layers 106. For details, refer to the foregoing description of the first redistribution layer 101. Details are not described herein again. In some embodiments, the second redistribution layer 102 includes a metal line layer 105 and an insulation layer 106.

The foregoing description that "the second redistribution layer 102 is electrically connected to at least one first redistribution layer 101 through a first via hole 104" means that the metal line layer 105 in the second redistribution layer 102 is electrically connected to metal line layers 105 in at least one first redistribution layer 101 through the first via hole 104. In addition, it is to be understood that, each first via hole 104 is electrically connected to only one first redistribution layer 101, that is, each first via hole 104 is electrically connected to only one chip 100.

It may be understood that, the first via hole 104 is filled with a conductive material, so that an electrical connection between the second redistribution layer 102 and the first redistribution layer 101 can be implemented. The conductive material may be, for example, a conductive material having a good conductive effect such as copper, aluminum, and nickel. Because copper has better conductivity, in some embodiments of this disclosure, the conductive material filled in the first via hole 104 is copper.

It is to be understood that, the plurality of chips 100 sequentially stacked may be considered as a whole, and if a passive side B of a chip 100 on the outermost side (for example, the first chip 100a or the second chip 100b) is away from a center of the whole relative to the active side F, it is considered that the passive side B of the chip 100 on the outermost side faces the outer side of the chip stacking structure 10. If the active side F of the chip 100 on the outermost side is away from the center of the whole relative to the passive side B, it is considered that the active side F of the chip 100 on the outermost side faces the outer side of the chip stacking structure 10.

Based on this, for any two adjacent chips 100 in the chip stacking structure 10, the two adjacent chips 100 may be connected together by using a binder. The two adjacent chips 100 may also be connected together in a fusion bonding manner.

Figure 4:
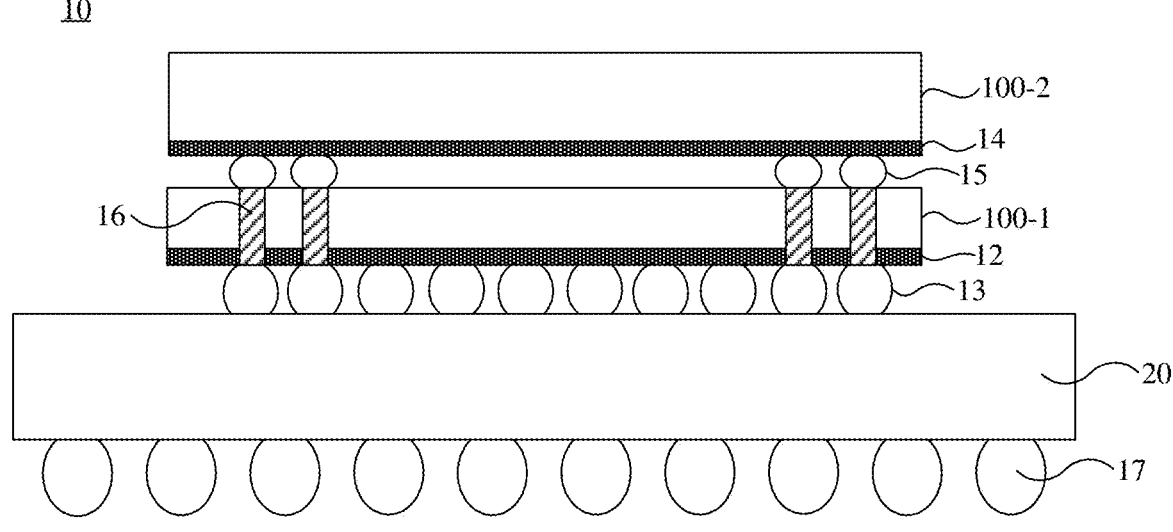
FIG. 4 is a schematic diagram of a structure of a chip stacking structure according to the conventional technology.

In the conventional technology, using an example in which the chip stacking structure 10 is manufactured by using a die-to-die bonding technique, as shown in FIG. 4, a chip 100-1 in the chip stacking structure 10 is connected to the package substrate 20 by using a first metal layer 12 and a controlled collapse chip connection (C4) bump 13, the chip 100-1 is connected to a chip 100-2 by using a second metal layer 14 and a micro bump 15, and the chip 100-2 is connected to the package substrate 20 by using a through silicon via 16 and the controlled collapse chip connection bump 13. The package substrate 20 communicates with the electronic system by using a solder ball 17. When the chip stacking structure 10 is manufactured, after the chip 100-1 is stacked, the through silicon via 16 and the micro bump 15 need to be formed on the chip 100-1, and then the chip 100-2 is stacked, so that the chip 100-2 is electrically connected to the package substrate 20 by using the second metal layer 14, the micro bump 15, the through silicon via 16, and the controlled collapse chip connection bump 13. If a chip 100-3 is also to be stacked, a through silicon via 16 and a micro bump 15 need to be formed on the chip 100-2, so that the chip 100-3 is electrically connected to the package substrate 20 by using the through silicon via 16 and the micro bump 15 formed on the chip 100-2, the through silicon via 16 and the micro bump 15 formed on the chip 100-1, and the controlled collapse chip connection bump 13. It can be learned that, a plurality of through silicon vias 16 need to be formed to implement an electrical connection between chip 100-3 and the package substrate 20, causing a complex process of manufacturing the chip stacking structure 10.

Embodiments of this disclosure provide a chip stacking structure 10. The chip stacking structure 10 includes a plurality of chips 100 sequentially stacked and a first redistribution layer 101 arranged on an active side F of each chip 100. The first redistribution layer 101 is in contact with and electrically connected to a corresponding chip 100. The plurality of chips include a first chip 100a and a second chip 100b located on an outermost side of the chip stacking structure 10. When both a passive side B of the first chip 100a and a passive side B of the second chip 100b face an outer side of the chip stacking structure 10, the chip stacking structure 10 further includes: a second redistribution layer 102 arranged on a side of the passive side B of the first chip 100a or a side of the passive side B of the second chip 100b. Alternatively, when a passive side B of the second chip 100b faces an outer side of the chip stacking structure 10, the active side F of the first chip 100a faces the outer side of the chip stacking structure 10, the chip stacking structure 10 further includes: a first dielectric layer 103 and a second redistribution layer 102 arranged on the active side F of the first chip 100a. The first dielectric layer 103 is located between the first redistribution layer 101 and the second redistribution layer 102. The second redistribution layer 102 is electrically connected to at least one first redistribution layer 101 through a first via hole 104. Because in the conventional technology, a via hole needs to be formed on a former chip 100 before a latter chip 100 is stacked, and the latter chip 100 is electrically connected to the former chip 100 through the via hole. In this case, via holes need to be formed for a plurality of times, so that the chips 100 can be electrically connected to an external circuit (for example, a package substrate). As a result, the process of manufacturing the chip stacking structure is complex. However, in embodiments of this disclosure, because the second redistribution layer 102 is electrically connected to at least one first redistribution layer 101 through the first via hole 104, and each first redistribution layer 101 is electrically connected to a corresponding chip 100, at least one chip 100 may be electrically connected to the second redistribution layer 102 through a first via hole 104. The second redistribution layer 102 is configured to be electrically connected to the external circuit, so that the chip 100 is electrically connected to the external circuit. Each first via hole 104 may be formed by using a one-time drilling process, so that the process of manufacturing the chip stacking structure 10 is simplified, production costs are saved, and production efficiency is improved.

In addition, when the chip stacking structure 10 shown in FIG. 4 is manufactured by using the die-to-die bonding technique, wafer cutting processing needs to be performed on the chip 100-1 and the chip 100-2, and impurity contamination may be caused during cutting. In view of this, the chip 100-1 and the chip 100-2 need to be cleaned before the chip 100-1 and the chip 100-2 are stacked, and a cleaning process is relatively complex. In addition, alignment needs to be performed when the chip 100-1 and the chip 100-2 are stacked. Higher alignment precision indicates a longer time for an alignment step. In addition, as a size of the chip 100 in the chip stacking structure 10 decreases, a requirement for the alignment precision becomes increasingly high, and the alignment step takes a longer time, resulting in a decrease in production efficiency (through put). Based on this, before the chips 100 are stacked, to use known qualified chips, chips need to be tested one by one. In this case, production efficiency is reduced, and production costs are increased. When the chip stacking structure 10 is manufactured by using a die-to-wafer bonding technique, steps such as cutting a wafer, aligning a chip with the wafer, and checking whether the chip is qualified also need to be performed, and consequently, problems such as reduced production efficiency and increased production costs also occur. Details are not described herein again.

However, in embodiments of this disclosure, when the chip stacking structure 10 is manufactured, and the chips 100 in the chip stacking structure 10 are dies, a plurality of wafers may be sequentially stacked, and then the plurality of wafers are cut to form the chip stacking structure 10. Compared with the die-to-die bonding technique and the die-to-wafer bonding technique in the conventional technology in which wafers are first cut, and then dies are stacked, because impurity contamination is caused during cutting of the wafers, the dies need to be cleaned before the dies are stacked. However, in embodiments of this disclosure, when the chip stacking structure 10 is manufactured, a plurality of wafers may be sequentially stacked together, and then the plurality of wafers are cut. A process of cleaning a chip stacking structure 10 obtained after cutting (where a chip is a die in this case) is much less complex than a cleaning process before the dies are stacked. In addition, compared with the die-to-die bonding technique and the die-to-wafer bonding technique in the conventional technology in which die-to-die alignment or die-to-wafer alignment needs to be performed on each die, because in embodiments of this disclosure, a wafer-to-wafer alignment operation only needs to be performed once during wafer-to-wafer stacking, to achieve alignment between a plurality of dies, thereby improving production efficiency and reducing production costs. Based on this, in embodiments of this disclosure, when the chip stacking structure 10 is manufactured, a plurality of wafers are directly stacked in sequence. There-fore, compared with the die-to-die bonding technique and the die-to-wafer bonding technique in the conventional technology, in this disclosure, there is no need to check dies one by one, which can improve production efficiency and reduce production costs. Based on this, compared with the conventional technology, in embodiments of this disclosure, when the chip stacking structure 10 is manufactured, a plurality of wafers are first stacked together, which simpli-fies a process and saves production costs.

Figure 5A:
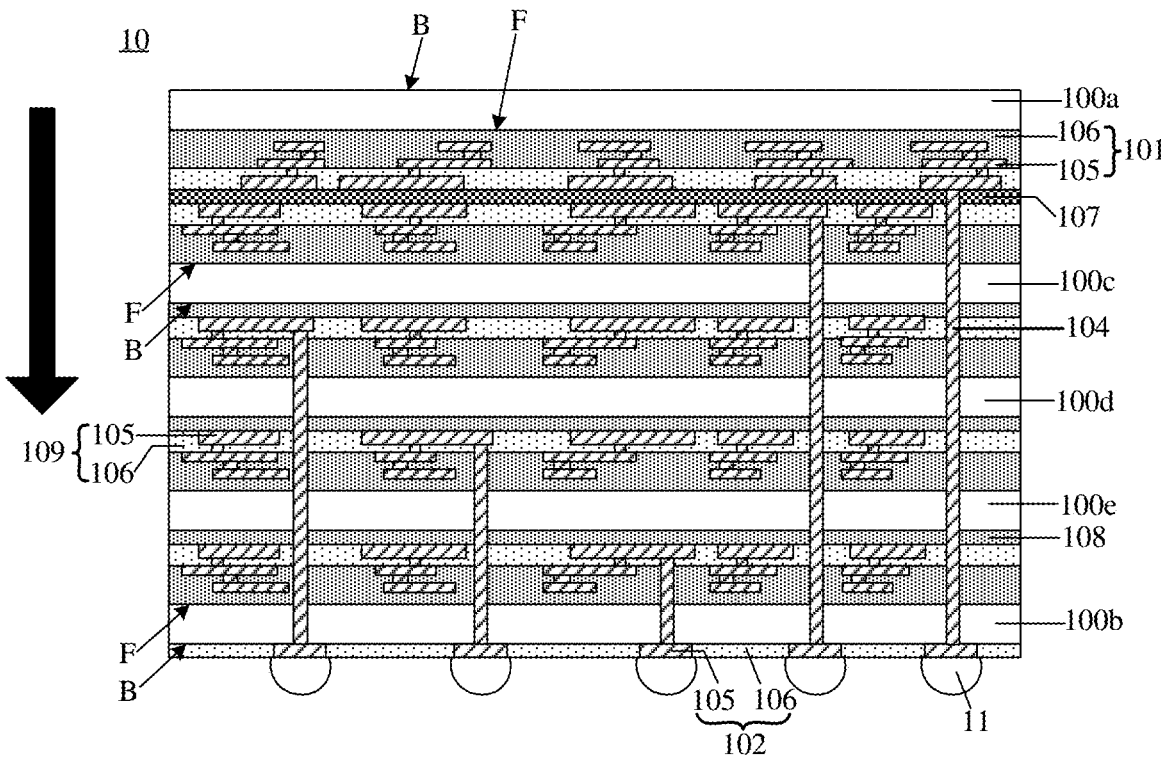
FIG. 5a is a schematic diagram of a structure of a chip stacking structure according to still another embodiment of this disclosure.
Figure 5B:
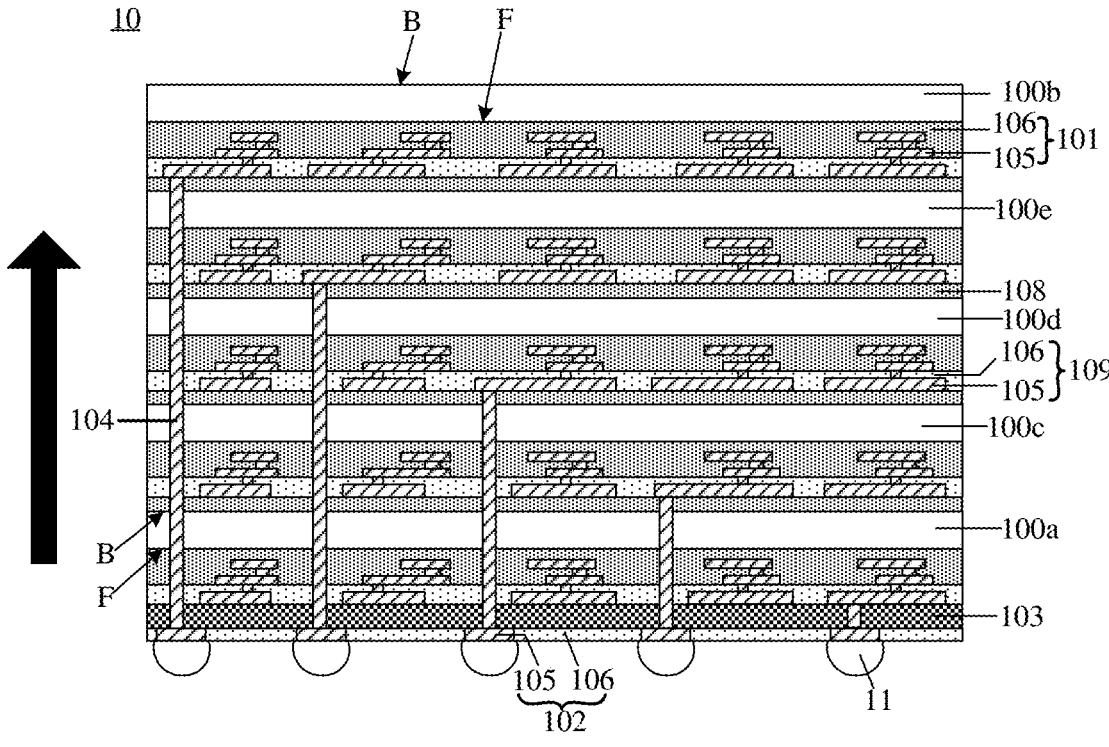
FIG. 5b is a schematic diagram of a structure of a chip stacking structure according to yet another embodiment of this disclosure.

In some embodiments, as shown in FIG. 5*a* and FIG. 5*b*, the chip stacking structure 10 further includes a micro bump 11 that is arranged on a side of the second redistribution layer 102 away from the chip 100 and that is electrically connected to the second redistribution layer 102.

Because the first redistribution layer 101 is electrically connected to the chip 100, the second redistribution layer 102 is electrically connected to at least one first redistribu-tion layer 101, and the second redistribution layer 102 is electrically connected to the micro bump 11, so that the micro bump 11 can be electrically connected to at least one chip 100. The micro bump 11 is configured to be electrically connected to the package substrate 20, so that the chip 100 can be electrically connected to the package substrate 20.

When any two chips 100 in the chip stacking structure 10 need to be electrically connected, in some embodiments, a connection between the any two chips 100 may be imple-mented by connecting micro bumps 11, to implement com-munication between the any two chips 100.

Figure 5C:
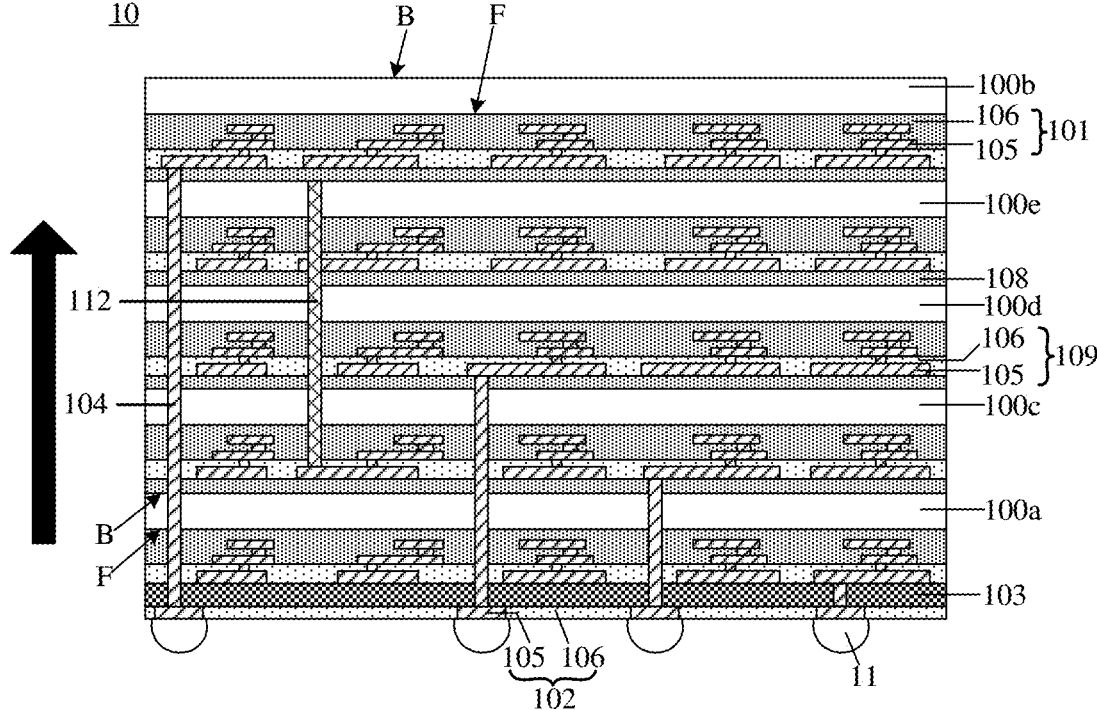
FIG. 5c is a schematic diagram of a structure of a chip stacking structure according to still yet another embodiment of this disclosure.

In some other embodiments, as shown in FIG. 5*c*, the chip stacking structure 10 further includes a second via hole 112. Any two first redistribution layers 101 are electrically con-nected through a second via hole 112, that is, any two chips 100 are electrically connected through the second via hole 112, to implement communication between the any two chips 100.

The two chips 100 that are electrically connected to the any two first redistribution layers 101 may be adjacent, or may not be adjacent. For example, as shown in FIG. 5*c*, a first redistribution layer 101 electrically connected to a third chip 100*c* and a first redistribution layer 101 electrically connected to a fifth chip 100*e* are electrically connected through the second via hole 112.

In the conventional technology, to implement an electrical connection between two non-adjacent chips 100, for example, to implement an electrical connection between the third chip 100*c* and the fifth chip 100*e*, a via hole needs to be formed on the third chip 100*c* after the third chip 100*c* is stacked. A fourth chip 100*d* is further stacked, and then a via hole is formed on the fourth chip 100*d*. Then, the fifth chip 100*e* is stacked, and the fifth chip 100*e* is electrically connected to the third chip 100*c* through the via hole formed on the third chip 100*c* and the via hole formed on the fourth chip 100*d*. In other words, in the conventional technology, a plurality of via holes need to be used to implement the electrical connection between two non-adjacent chips 100, causing a complex process of manufacturing the chip stack-ing structure 10. However, in this embodiment of this disclosure, two non-adjacent chips 100 may be electrically connected through the second via hole 112, and one second via hole 112 may be manufactured by using a one-time drilling process, which can simplify the process of manu-facturing the chip stacking structure 10. For example, as shown in FIG. 5*c*, to implement the electrical connection between the third chip 100*c* and the fifth chip 100*e*, a second via hole 112 is formed after the first chip 100*a*, the third chip 100*c*, the fourth chip 100*d*, and the fifth chip 100*e* are stacked, and the second via hole 112 passes through the third chip 100*c*, the fourth chip 100*d*, and the fifth chip 100*e*, to implement the electrical connection between the third chip 100*c* and the fifth chip 100*e*.

For how to stack a plurality of chips 100 in the chip stacking structure 10, the following provides two specific implementations by using examples.

In a first implementation, as shown in FIG. 5*a*, when the second redistribution layer 102 is located on the side of the passive side B of the first chip 100*a* or the side of the passive side B of the second chip 100*b*, the plurality of chips 100 further include a third chip 100*c* arranged between the first chip 100*a* and the second chip 100*c*. The active side F of the first chip 100*a* is opposite to the active side F of the third chip 100*c*, and the active side F of the second chip 100*b* faces a passive side B of the third chip 100*c*. The chip stacking structure 10 further includes a second dielectric layer 107 arranged between the active side F of the first chip 100*a* and the active side F of the third chip 100*c*.

It is to be noted that, as shown in FIG. 5*a*, when the chip stacking structure 10 further includes a fourth chip 100*d*, the fourth chip 100*d* is stacked on the third chip 100*c*, and the active side F of the fourth chip 100*d* faces the passive side B of the third chip 100*c*. When the chip stacking structure 10 further includes a fifth chip 100*e*, the fifth chip 100*e* is stacked on the fourth chip 100*d*, and the active side F of the fifth chip 100*e* faces a passive side B of the fourth chip 100*d*. The rest may be deduced by analogy, and details are not described herein again.

Based on the above, in other words, as shown in FIG. 5*a*, when the second redistribution layer 102 is located on the side of the passive side B of the first chip 100*a* or the side of the passive side B of the second chip 100*b*, in addition to the first chip 100*a* and the third chip 100*c*, the active side F of a latter chip faces a passive side B of a former chip 100 in a stacking direction (where the stacking direction is indicated by a thick arrow in FIG. 5*a*). The active side F of the first chip 100*a* is opposite to the active side F of the third chip 100*c*. The chip stacking structure 10 further includes a second dielectric layer 107 arranged between the active side F of the first chip 100*a* and the active side F of the third chip 100*c*.

FIG. 5*a* is illustrated by using an example in which the second redistribution layer 102 is located on the side of the passive side B of the second chip 100*b*.

The second dielectric layer 107 arranged between the active side F of the first chip 100*a* and the active side F of the third chip 100*c* may separate the active side F of the first chip 100*a* from the active side F of the third chip 100*c*. In addition, the second dielectric layer 107 may be formed on the active side F of the first chip 100*a*, and the first chip 100*a* and the third chip 100*c* are bonded together in a manner of fusion bonding. Alternatively, the second dielectric layer 107 may be formed on the active side F of the third chip 100*c*, and then the first chip 100*a* and the third chip 100*c* are bonded together in a manner of fusion bonding.

It is to be understood that, in the chip stacking structure 10, because the active side F of the first chip 100*a* is opposite to the active side F of the third chip 100*c*, the passive side B of the first chip 100*a* faces the outer side of the chip stacking structure 10. In addition, because the active side F of the latter chip 100 faces the passive side B of the former chip 100, a passive side B of a last chip, that is, the second chip 100*b* faces the outer side of the chip stacking structure 10. In this way, in the stacking structure, passive sides of two chips that are located on the outermost side, namely, the first chip 100*a* and the second chip 100*b*, face the outer side of the chip stacking structure 10.

If the plurality of chips 100 are sequentially stacked according to the first implementation, the first via hole 104 may be manufactured starting from a passive side B of a last chip, that is, the second chip 100*b*. In addition to the first chip 100*a*, for another chip 100, when the first via hole 104 is manufactured, the first via hole 104 is penetrated from a passive side B of the chip 100 to the active side F of the chip 100. Therefore, such a drilling manner may also be referred to as a back-side drilling manner, that is, a plurality of first via holes 104 are formed in the back-side drilling manner. In this case, the second redistribution layer 102 is located on the passive side B of the second chip 100*b*. Alternatively, the first via hole 104 may be manufactured starting from the passive side B of the first chip 100*a*. In addition to the first chip 100*a*, for another chip 100, when the first via hole 104 is manufactured, the first via hole 104 is penetrated from the active side F of the chip 100 to a passive side B of the chip 100. Therefore, such a drilling manner may also be referred to as a front-side drilling manner, that is, a plurality of first via holes 104 are formed in the front-side drilling manner. In this case, the second redistribution layer 102 is located on the passive side B of the first chip 100*a*.

In a second implementation, as shown in FIG. 5*b*, when the second redistribution layer 102 is located on the active side F of the first chip 100*a*, the active side F of the second chip 100*b* faces the passive side B of the first chip 100*a*.

It is to be noted that, as shown in FIG. 5*b*, when the chip stacking structure 10 further includes a third chip 100*c*, the third chip 100*c* is stacked on the first chip 100*a*, and the active side F of the third chip 100*c* faces the passive side B of the first chip 100*a*. When the chip stacking structure 10 further includes a fourth chip 100*d*, the fourth chip 100*d* is stacked on the third chip 100*c*, and the active side F of the fourth chip 100*d* faces the passive side B of the third chip 100*c*. When the chip stacking structure 10 further includes a fifth chip 100*e*, the fifth chip 100*e* is stacked on the fourth chip 100*d*, and the active side F of the fifth chip 100*e* faces a passive side B of the fourth chip 100*d*. The rest may be deduced by analogy, and details are not described herein again. Finally, the second chip 100*b* is stacked.

Based on the above, in other words, as shown in FIG. 5*b*, when the second redistribution layer 102 is located on the active side F of the first chip 100*a*, the active side F of a latter chip 100 faces a passive side B of a former chip 100 in a stacking direction (where the stacking direction is indicated by a thick arrow in FIG. 5*b*).

It is to be understood that, in the chip stacking structure 10, because the active side F of the latter chip 100 faces the passive side B of the former chip 100, for the two chips located on the outermost side, namely, the first chip 100*a* and the second chip 100*b*, the active side F of the first chip 100*a* faces the outer side of the chip stacking structure 10, and the passive side B of the second chip 100*b* faces the outer side of the chip stacking structure 10.

If the plurality of chips 100 are sequentially stacked according to the second implementation, the first via hole 104 may be manufactured starting from the active side F of the first chip 100*a*. For any chip 100, when the first via hole 104 is manufactured, the first via hole 104 is penetrated from the active side F of the chip 100 to a passive side B of the chip 100. Therefore, such a drilling manner may also be referred to as a front-side drilling manner, that is, a plurality of first via holes 104 are formed in the front-side drilling manner.

In some embodiments, as shown in FIG. 5*a* and FIG. 5*b*, the chip stacking structure 10 further includes a third dielectric layer 108 arranged between the first redistribution layer 101 and a passive side B of the chip 100 adjacent to the first redistribution layer 101.

Because the third dielectric layer 108 is arranged between the first redistribution layer 101 and a passive side F of the chip 100 adjacent to the first redistribution layer 101, the third dielectric layer 108 may be first formed on a side of the passive side B of the chip 100, and then two adjacent chips 100 are bonded together in a fusion bonding manner.

It is to be noted that, materials of the first dielectric layer 103, the second dielectric layer 107, and the third dielectric layer 108 may be the same, or may be different. For example, the materials of the first dielectric layer 103, the second dielectric layer 107, and the third dielectric layer 108 may be one or more of silicon nitride (SiNx), silicon oxide (SiOx), or silicon oxynitride (SiOxNy).

In some embodiments, as shown in FIG. 2*a*, FIG. 2*b*, FIG. 5*a*, and FIG. 5*b*, the chip stacking structure 10 further includes a third redistribution layer 109 arranged on a side of the first redistribution layer 101 away from a chip 100 electrically connected to the first redistribution layer 101. The third redistribution layer 109 is electrically connected to the first redistribution layer 101, and the second redistribution layer 102 is electrically connected to the third redistribution layer 109 through a first via hole 104. A thickness of a metal line layer 105 in the third redistribution layer 109 is greater than a thickness of a metal line layer 105 in the first redistribution layer 101.

In addition, the third redistribution layer 109 includes one or more metal line layers 105 and one or more insulation layers 106. For details, refer to the foregoing description of the first redistribution layer 101. Details are not described herein again. In some embodiments, the third redistribution layer 109 includes a metal line layer 105 and an insulation layer 106.

It is to be understood that, the foregoing description that "the second redistribution layer 102 is electrically connected to the third redistribution layer 109 through a first via hole 104" means that the metal line layer 105 in the second redistribution layer 102 is electrically connected to the metal line layer 105 in the third redistribution layer 109 through the first via hole 104.

In this embodiment of this disclosure, because the thickness of the metal line layer 105 in the third redistribution layer 109 is greater than the thickness of the metal line layer 105 in the first redistribution layer 101, the second redistribution layer 102 is electrically connected to the third redistribution layer 109 through the first via hole 104. In this way, reliability of an electrical connection between the second redistribution layer 102 and the third redistribution layer 109 can be ensured, thereby improving reliability of an electrical connection between the second redistribution layer 102 and the chip 100.

An embodiment of this disclosure further provides a chip stacking structure manufacturing method, which may be applied to manufacture the foregoing chip stacking structure 10. As shown in FIG. 6, the chip stacking structure manufacturing method includes the following steps.

S10: Sequentially stack a plurality of chips 100. A first redistribution layer 101 is formed on a side of an active side F of each chip 10, and the first redistribution layer 101 is in contact with and electrically connected to a corresponding chip 100. The plurality of chips 100 include a first chip 100*a* and a second chip 100*b* that are located at an outermost side of the plurality of chips that are sequentially stacked.

It is to be noted that, the chip 100 in this embodiment of this disclosure may be a die, or may be a wafer. Based on this, in some embodiments, the plurality of chips 100 are dies. In some other embodiments, the plurality of chips 100 are wafers. In still other embodiments, a first chip 100a in the plurality of chips 100 is a wafer, and the other chips are dies.

In some embodiments, a surface of the chip 100 needs to be cleaned before the plurality of chips 100 are stacked together.

For a structure of the first redistribution layer 101, refer to the foregoing embodiment, and details are not described herein again. Based on this, that the first redistribution layer 101 is electrically connected to a corresponding chip 100 means that a metal line layer 105 in the first redistribution layer 101 is electrically connected to a circuit structure of the active side F of the chip 100.

In addition, for any two adjacent chips 100, the two adjacent chips 100 may be connected together by using a binder. The two adjacent chips 100 may also be connected together in a fusion bonding manner.

In addition, a quantity of chips 100 sequentially stacked may be set based on an application requirement. For example, four or six chips 100 may be sequentially stacked together.

S11: Form a plurality of first via holes 104, and fill the first via holes 104 with a conductive material.

The first via holes 104 may be manufactured, by dry etching or wet etching, in the plurality of chips 100 sequentially stacked in S10. Specifically, the plurality of first via holes 104 may be formed by using a through silicon via technology. After the first via holes 104 are formed, the first via holes 104 may be filled with a conductive material by using a method such as chemical vapor deposition, sputter deposition, ion beam deposition, physical vapor deposition, atomic layer deposition, or molecular beam epitaxial evaporation. The conductive material may be, for example, a conductive material having a good conductive effect such as copper, aluminum, and nickel. Because copper has better conductivity, in some embodiments of this disclosure, the conductive material filled in the first via hole 104 is copper.

It is to be noted that, based on a process used for forming the first via holes 104, the plurality of first via holes 104 of different depths may be synchronously manufactured, or may be separately manufactured.

After step S11, based on different stacking manners of the plurality of chips 100 in S10, step S12 may be implemented in the following two manners.

In a first manner, when both a passive side B of the first chip 100a and a passive side B of the second chip 100b face an outer side of the plurality of chips 100 stacked sequentially, S12 includes:

forming a second redistribution layer 102 on a side of the passive side B of the first chip 100a or a side of the passive side B of the second chip 100b, where the second redistribution layer 102 is electrically connected to at least one first redistribution layer 101 through a first via hole 104, and the second redistribution layer 102 is configured to electrically connect the first redistribution layer 101 to the package substrate 20.

In a second manner, when a passive side B of the second chip 100b faces an outer side of the plurality of chips 100 sequentially stacked, the active side F of the first chip 100a faces the outer side of the plurality of chips 100 sequentially stacked, and a first dielectric layer 103 is further formed on the active side F of the first chip 100a, S12 includes:

forming a second redistribution layer 102 on the side of the active side F side of the first chip 100a, where the second redistribution layer 102 is located on a side of the first dielectric layer 103 away from the first redistribution layer 101, the second redistribution layer 102 is electrically connected to at least one first redistribution layer 101 through a first via hole 104, and the second redistribution layer 102 is configured to electrically connect the first redistribution layer 101 to the package substrate 20.

For a structure of the second redistribution layer 102, refer to the foregoing descriptions, and details are not described herein again.

When at least one of the plurality of chips is a wafer, the manufacturing method further includes the following steps.

S13. Cut a wafer to form a chip stacking structure 10.

It is to be noted that, step S13 is an optional step, and this step may be omitted when the plurality of chips are all dies.

It is to be understood that, after the wafer is cut, a plurality of chip stacking structures 10 that have identical structures and identical functions may be obtained.

An embodiment of this disclosure provides a chip stacking structure manufacturing method. The chip stacking structure manufacturing method includes: sequentially stacking a plurality of chips 100, where a first redistribution layer 101 is formed on a side of an active side F of each chip 100, and the first redistribution layer 101 is in contact with and electrically connected to a corresponding chip 100; and the plurality of chips 100 include a first chip 100a and a second chip 100b that are located at an outermost side of the plurality of chips 100 sequentially stacked; forming a plurality of first via holes 104, and filling the first via holes 104 with a conductive material; forming a second redistribution layer 102 on a side of the passive side B of the first chip 100a or a side of the passive side B of the second chip 100b when both the passive side B of the first chip 100a and the passive side B of the second chip 100b face the outer side of the plurality of chips 100 sequentially stacked, where the second redistribution layer 102 is electrically connected to at least one first redistribution layer 101 through a first via hole 104; or forming a second redistribution layer 102 on a side of the active side F of the first chip 100a when the passive side B of the second chip 100b faces the outer side of the plurality of chips 100 sequentially stacked, the active side F of the first chip 100a faces the outer side of the plurality of chips 100 sequentially stacked, and a first dielectric layer 103 is further formed on the active side F of the first chip 100a, where the second redistribution layer 102 is located on a side of the first dielectric layer 103 away from the first redistribution layer 101; and the second redistribution layer 102 is electrically connected to at least one first redistribution layer 101 through a first via hole 104. Compared with the conventional technology, a plurality of via holes need to be manufactured to implement an electrical connection between chips 100 and the outside. In embodiments of this disclosure, in a process of manufacturing the chip stacking structure 10, after a plurality of chips 100 are stacked together, each first via hole 104 is manufactured by one-time drilling. The first redistribution layer 101 electrically connected to the chip 100 is electrically connected to the second redistribution layer 102 through the first via hole 104, that is, at least one chip 100 is electrically connected to the second redistribution layer 102 through the first via hole 104, and the second redistribution layer 102 is electrically connected to an external circuit, to implement an electrical connection between the chips 100 and the external circuit. Therefore, embodiments of this disclosure help simplify the process of manufacturing the chip stacking structure 10, save production costs, and improve production efficiency.

Based on this, compared with the die-to-die bonding technique and the die-to-wafer bonding technique in the conventional technology in which wafers are first cut, and then dies are stacked, because impurity contamination is caused during cutting of the wafers, the dies need to be cleaned before the dies are stacked. However, in embodiments of this disclosure, when the chip stacking structure 10 is manufactured, a plurality of wafers may be sequentially stacked together, and then the plurality of wafers are cut. A process of cleaning a chip stacking structure 10 obtained after cutting (where a chip is a die in this case) is much less complex than a cleaning process before the dies are stacked. In addition, compared with the die-to-die bonding technique and the die-to-wafer bonding technique in the conventional technology in which die-to-die alignment or die-to-wafer alignment needs to be performed on each die, because in embodiments of this disclosure, a wafer-to-wafer alignment operation only needs to be performed once during wafer-to-wafer stacking, to achieve alignment between a plurality of dies, thereby improving production efficiency and reducing production costs. Based on this, in embodiments of this disclosure, when the chip stacking structure 10 is manufactured, a plurality of wafers are directly stacked in sequence. Therefore, compared with the die-to-die bonding technique and the die-to-wafer bonding technique in the conventional technology, in this disclosure, there is no need to check dies one by one, which can improve production efficiency and reduce production costs. Based on this, compared with the conventional technology, in embodiments of this disclosure, when the chip stacking structure 10 is manufactured, a plurality of wafers are first stacked together, which simplifies a process and saves production costs.

In embodiments of this disclosure, before wafer stacking, to improve production efficiency, whether a die in a wafer is qualified is not checked. However, when a chip in the chip stacking structure 10 is a die, the chip stacking structure 10 manufactured in embodiments of this disclosure may improve a yield of the chip stacking structure 10 in another manner. For example, in the process of manufacturing the chip stacking structure 10, a quantity of stacked wafers is increased, that is, a quantity of dies in the chip stacking structure 10 is increased, so that a corresponding function can be realized by using qualified dies. Alternatively, a redundancy method is used, so that a function corresponding to a die in the conventional technology is realized by using a plurality of dies.

In some embodiments, a third redistribution layer 109 on a side of the first redistribution layer 101 away from a chip 100 electrically connected to the first redistribution layer 101 is further formed on the active side F of each chip 100. The third redistribution layer 109 is electrically connected to the first redistribution layer 101, and the second redistribution layer 102 is electrically connected to the third redistribution layer 109 through a first via hole 104. A thickness of a metal line layer 105 in the third redistribution layer 109 is greater than a thickness of a metal line layer 105 in the first redistribution layer 101.

For a structure of the third redistribution layer 109, refer to the foregoing embodiment, and details are not described herein again.

In this embodiment of this disclosure, because the thickness of the metal line layer 105 in the third redistribution layer 109 is greater than the thickness of the metal line layer 105 in the first redistribution layer 101, the second redistribution layer 102 is electrically connected to the third redistribution layer 109 through the first via hole 104. In this way, reliability of an electrical connection between the second redistribution layer 102 and the third redistribution layer 109 can be ensured, thereby improving reliability of an electrical connection between the second redistribution layer 102 and the chip 100.

A specific implementation of the chip stacking structure 10 manufacturing method when a plurality of chips 100 are stacked in different manners is described below by using an example.

In an optional embodiment, for example, manufacturing of the chip stacking structure 10 shown in FIG. 5a specifically includes the following steps.

Figures 7, 8:
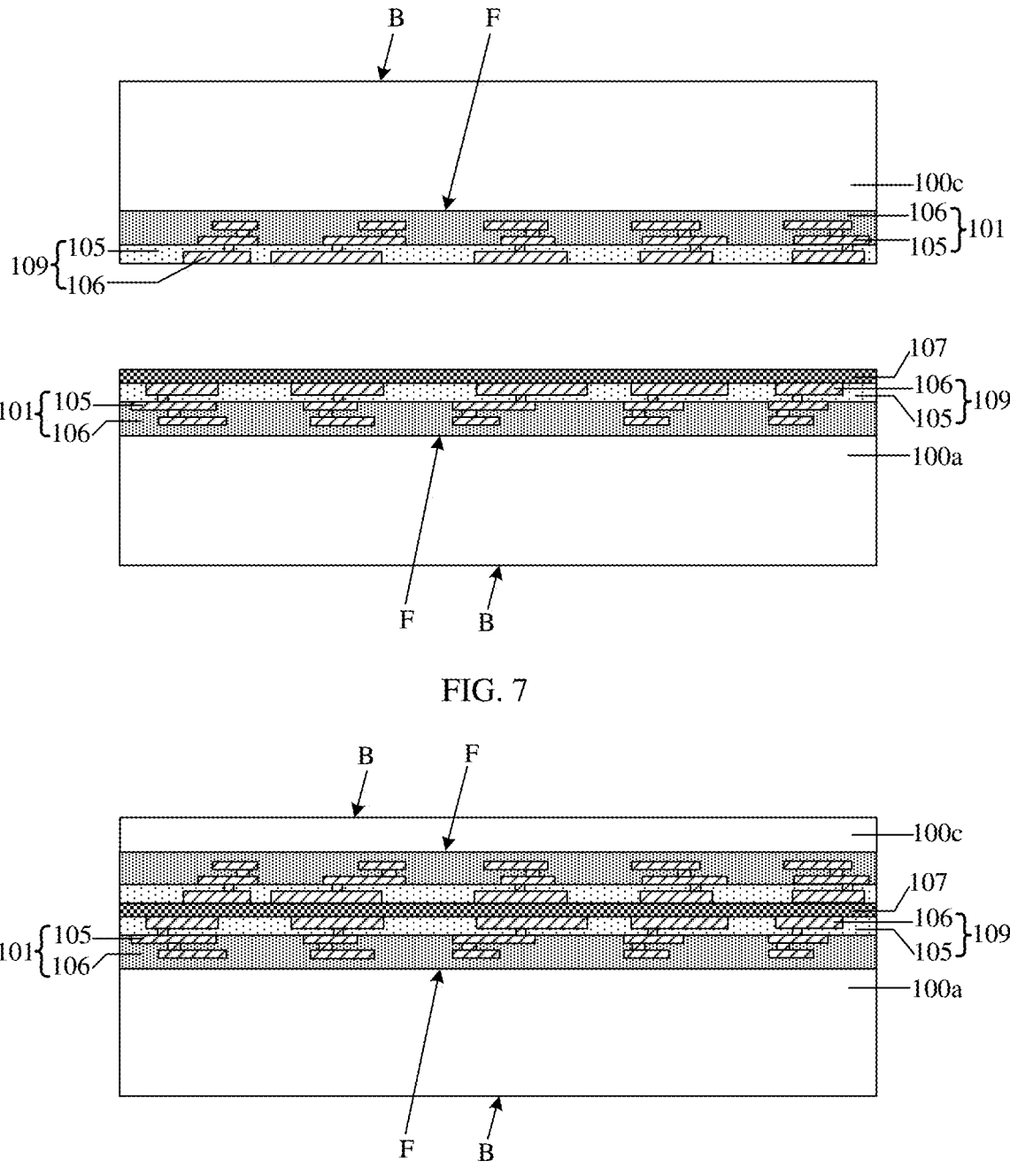
FIG. 7 is a schematic structural diagram 1 in a process of a chip stacking structure manufacturing method according to an embodiment of this disclosure.
FIG. 8 is a schematic structural diagram 2 in a process of a chip stacking structure manufacturing method according to an embodiment of this disclosure.

S20: As shown in FIG. 7, stack the third chip 100c on the first chip 100a. The active side F of the third chip 100c faces the active side F of the first chip 100a. A second dielectric layer 107 is formed between the first redistribution layer 101 of the first chip 100a and the first redistribution layer 101 of the third chip 100c.

The second dielectric layer 107 may be formed on a side of the first redistribution layer 101 of the first chip 100a away from the first chip 100a. Alternatively, the second dielectric layer 107 may be formed on a side of the first redistribution layer 101 of the third chip 100c away from the third chip 100c. FIG. 7 is illustrated by using an example in which the second dielectric layer 107 is formed on the side of the first redistribution layer 101 of the first chip 100a away from the first chip 100a.

In addition, the first chip 100a and the third chip 100c may be connected together by using a binder, or may be connected together in a fusion bonding manner. When the first chip 100a and the third chip 100c are connected together in the fusion bonding manner, organic contamination (where the binder is usually an organic substance) can be avoided. When the chip 100 is a wafer, a problem such as wafer warpage can be avoided, thereby ensuring process reliability.

S21: Perform thinning processing on a passive side B of the third chip 100c, stack the second chip 100b on the passive side B of the third chip 100c, and perform thinning processing on the passive side B of the second chip 100b. The active side F of the second chip 100b faces the passive side B of the third chip 100c.

It is to be noted that, when the chip stacking structure 10 further includes a fourth chip 100d, after thinning processing is performed on the passive side B of the third chip 100c, the fourth chip 100d is stacked on the passive side B of the third chip 100c, the active side F of the fourth chip 100d faces the passive side B of the third chip 100c, and thinning processing is performed on a passive side B of the fourth chip 100d. When the chip stacking structure 10 further includes a fifth chip 100e, thinning processing is performed on the passive side B of the fourth chip 100d, the fifth chip 100e is stacked on the passive side B of the fourth chip 100d, the active side F of the fifth chip 100e faces the passive side B of the fourth chip 100d, and thinning processing is performed on a passive side B of the fifth chip 100e. The rest may be deduced by analogy, and details are not described herein again. Finally, the second chip 100b is stacked, and thinning processing is performed on the passive side B of the second chip 100b.

It is to be noted that, the passive side B of the chip 100 may be thinned to a desired thickness in a physical grinding manner and/or a chemical mechanical polishing manner.

In some embodiments of this disclosure, after the chip 100 is thinned, a final thickness h of the chip 100 is in a range of $0 < h \leq 100$ µm.

Two adjacent chips 100 may be connected together by using a binder, or may be connected together in a fusion bonding manner.

In some embodiments, after thinning processing is performed on the passive side B of the third chip 100*c*, and before the second chip 100*b* is stacked on the passive side B of the third chip 100*c*, the chip stacking structure 10 manufacturing method further includes: forming a third dielectric layer 108 on a side of the passive side B of the third chip 100*c*.

Because the third dielectric layer 108 is formed on the side of the passive side B of the third chip 100*c* before the second chip 100*b* is stacked on the passive side B of the third chip 100*c*, when the second chip 100*b* is stacked on the passive side B of the third chip 100*c*, the second chip 100*b* and the third chip 100*c* may be stacked together in the fusion bonding manner. Compared with connecting by using the adhesive, the fusion bonding manner can avoid organic contamination (where the binder is usually an organic substance). In addition, when the second chip 100*b* and/or the third chip 100*c* are/is a wafer, a problem such as wafer warpage can be avoided, thereby ensuring process reliability.

Figure 9:
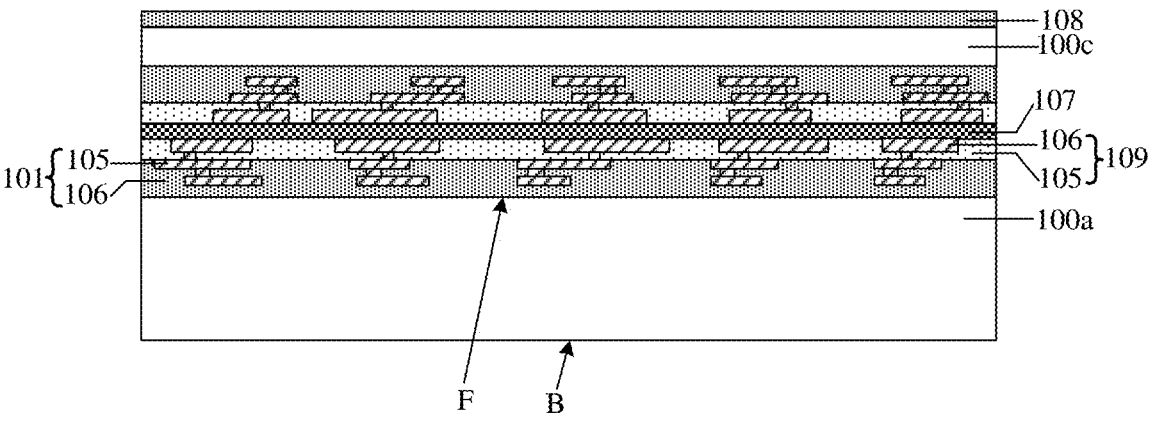
FIG. 9 is a schematic structural diagram 3 in a process of a chip stacking structure manufacturing method according to an embodiment of this disclosure.
Figure 10:
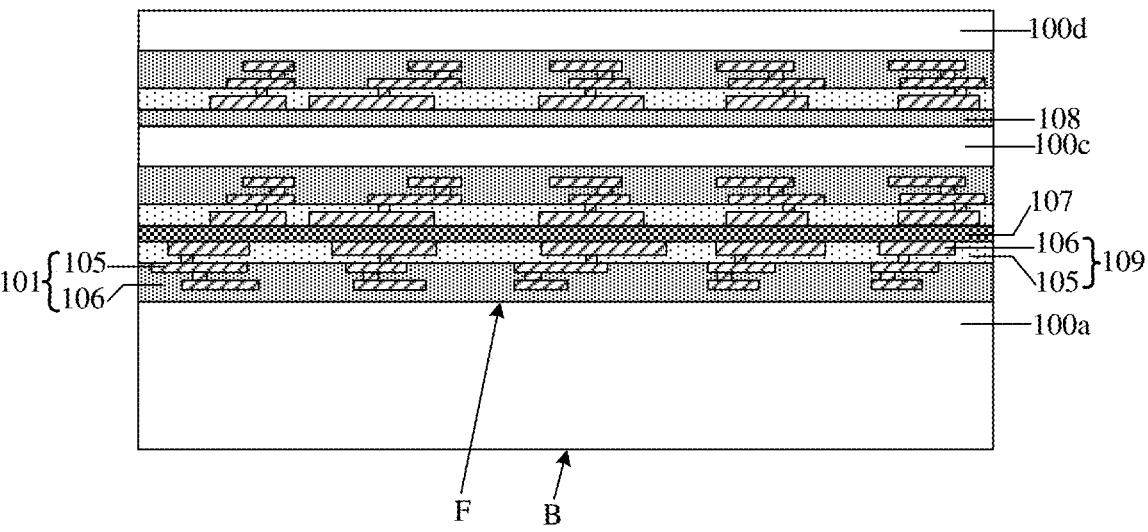
FIG. 10 is a schematic structural diagram 4 in a process of a chip stacking structure manufacturing method according to an embodiment of this disclosure.
Figure 11:
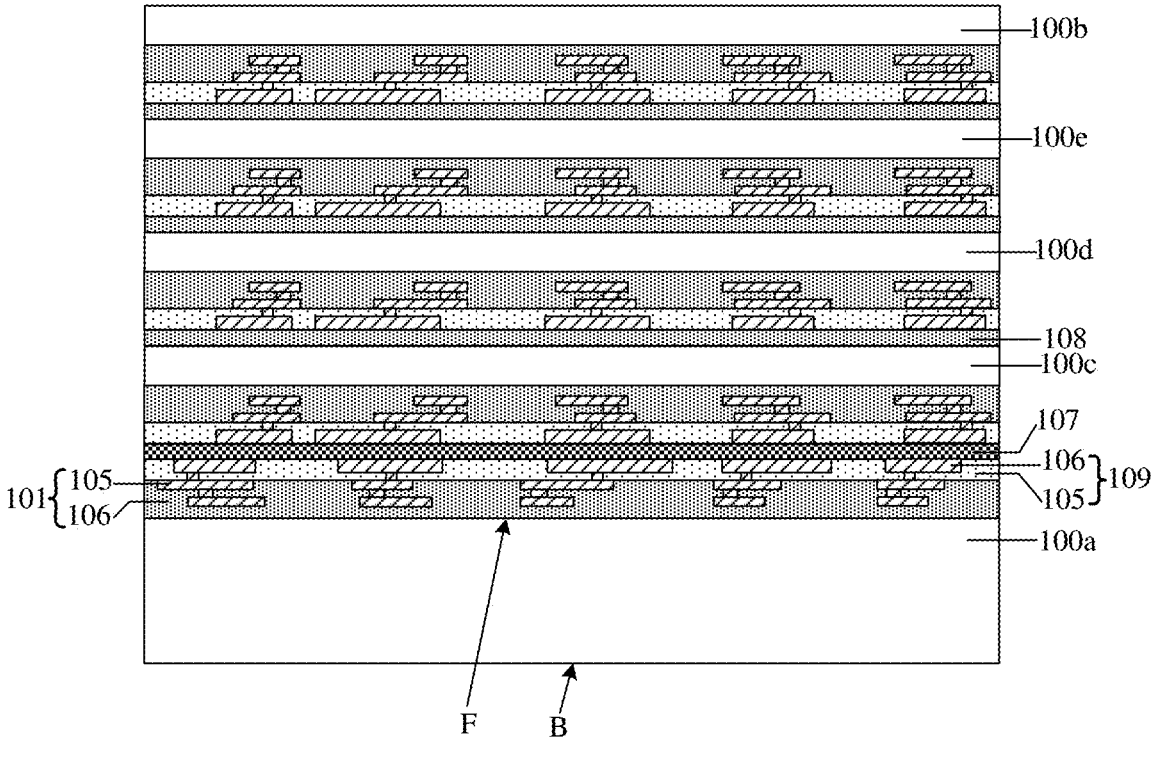
FIG. 11 is a schematic structural diagram 5 in a process of a chip stacking structure manufacturing method according to an embodiment of this disclosure.

The following describes step S21 in detail. Specifically, as shown in FIG. 8, thinning processing is first performed on the passive side B of the third chip 100*c*. Then, as shown in FIG. 9, the third dielectric layer 108 is formed on the passive side B of the third chip 100*c*. Next, as shown in FIG. 10, the fourth chip 100*d* is stacked on the passive side B of the third chip 100*c*, the active side F of the fourth chip 100*d* faces the passive side B of the third chip 100*c*, and thinning processing is performed on the passive side B of the fourth chip 100*d*. By analogy, as shown in FIG. 11, a plurality of chips are sequentially stacked, and thinning processing is performed on a passive side B of a last chip, that is, the second chip 100*b*.

Figure 12:
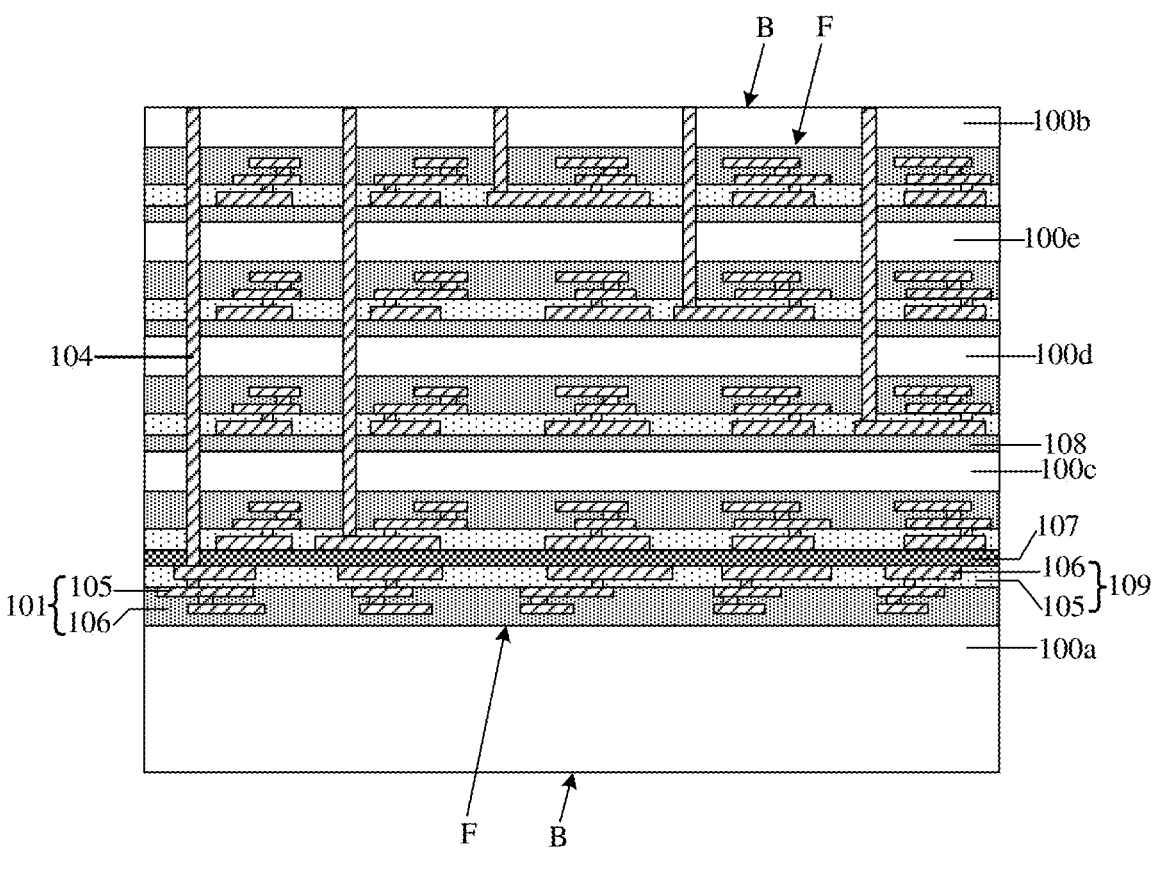
FIG. 12 is a schematic structural diagram 6 in a process of a chip stacking structure manufacturing method according to an embodiment of this disclosure.

S22: As shown in FIG. 12, form a plurality of first via holes 104 on a side of the second chip 100*b*, fill the first via holes 104 with a conductive material, where each first via hole 104 is electrically connected to one first redistribution layer 101.

It is to be noted that, the plurality of first via holes 104 are formed on the side of the second chip 100*b*. In addition to a first chip 100*a* in a stacking direction, for another chip, when the first via hole 104 is manufactured, the first via hole 104 is penetrated from a passive side B of the chip 100 to the active side F of the chip 100. Therefore, such a drilling manner may also be referred to as a back-side drilling manner, that is, a plurality of first via holes 104 are formed in the back-side drilling manner.

For a specific implementation of this step, refer to step S11 described above.

When a third redistribution layer 109 located on a side of the first redistribution layer 101 away from a chip 100 electrically connected to the first redistribution layer 101 is further formed on the active side F of each chip 100, each first via hole 104 is electrically connected to one third redistribution layer 109.

Figure 13:
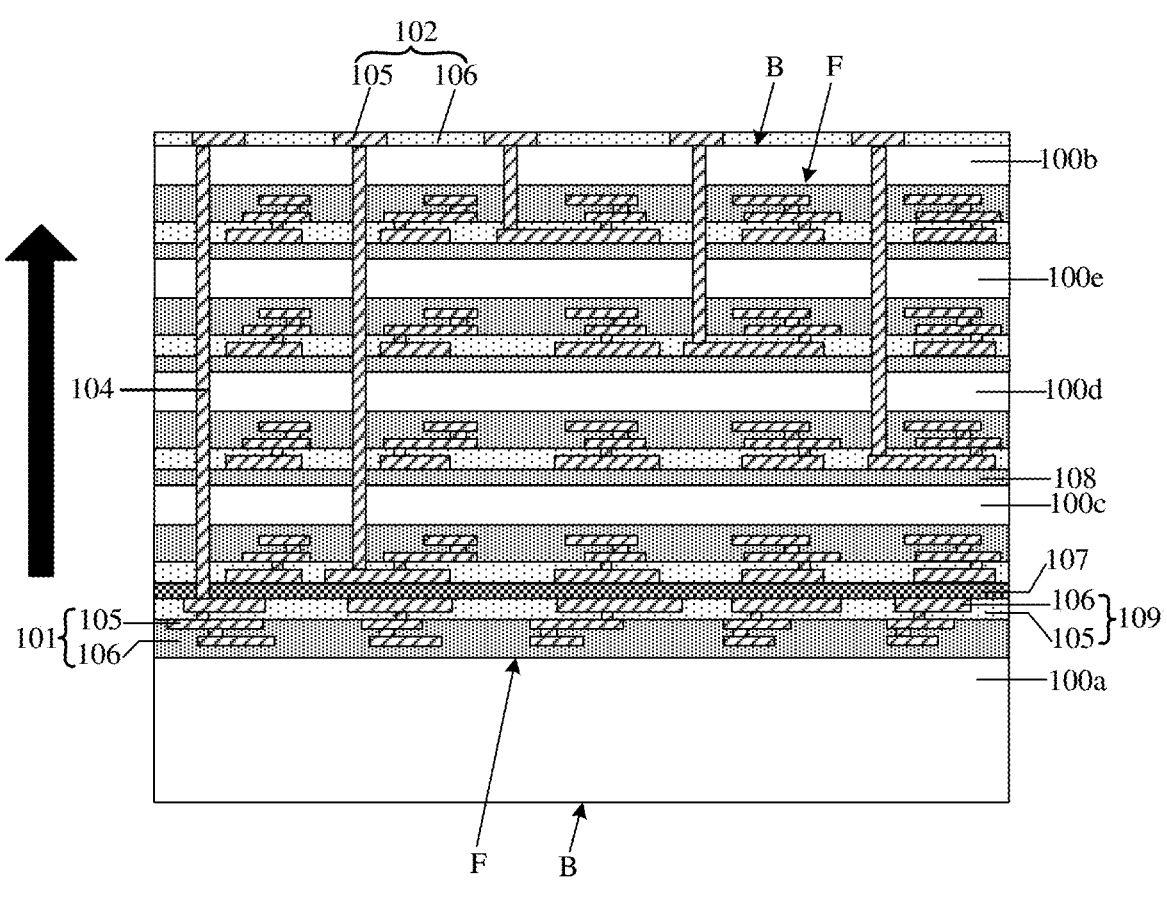
FIG. 13 is a schematic structural diagram 7 in a process of a chip stacking structure manufacturing method according to an embodiment of this disclosure.

S23: As shown in FIG. 13, form, in a stacking direction (where the stacking direction is indicated by a thick arrow in FIG. 13), a second redistribution layer 102 on a side of a passive side B of a last chip 100, that is, the second chip 100*b*.

For a structure of the second redistribution layer 102, refer to the foregoing embodiment, and details are not described herein again.

Figure 14:
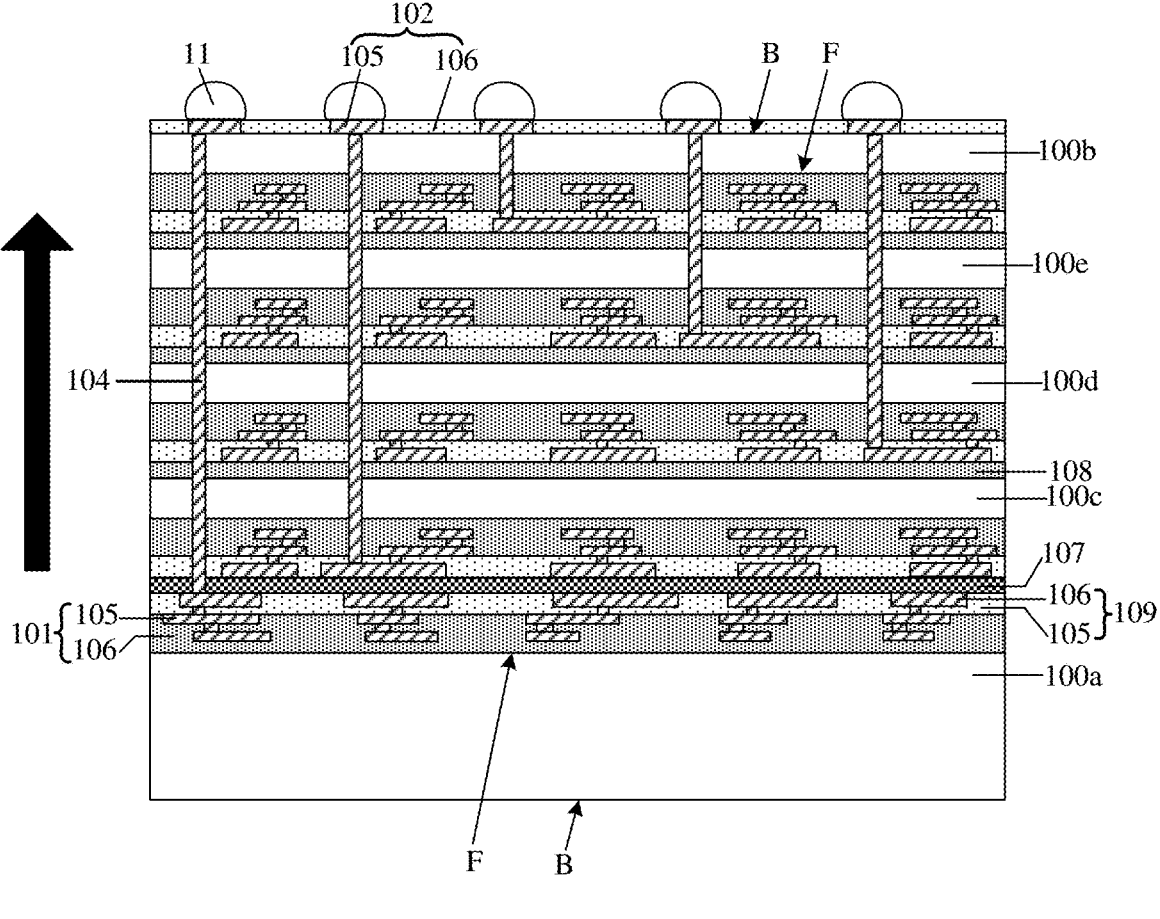
FIG. 14 is a schematic structural diagram 8 in a process of a chip stacking structure manufacturing method according to an embodiment of this disclosure.

S24: As shown in FIG. 14, form a micro bump 11 electrically connected to the second redistribution layer 102 on a side of the second redistribution layer 102 away from the second chip 100*b*.

It is to be noted that, this step is an optional step, for example, this step may also be omitted in some embodiments.

S25: As shown in FIG. 5*a*, perform thinning processing on the passive side B of the first chip 100*a*.

The passive side B of the first chip 100*a* may be thinned to a desired thickness in a physical grinding manner and/or a chemical mechanical polishing manner.

When at least one of the plurality of chips is a wafer, the manufacturing method further includes the following steps.

S26: Cut a wafer to form a chip stacking structure 10 as shown in FIG. 5*a*.

It is to be noted that, an order of step S25 and step S26 may be exchanged. For example, step S25 is performed first, and then step S26 is performed. In another example, step S26 is performed first, and then step S25 is performed.

Step S26 is an optional step, and this step may be omitted when the plurality of chips are all dies.

Based on the above, steps S21, S22, S23, S24, and S25 may also be performed with reference to the following steps.

S27: Perform thinning processing on the passive side B of the third chip 100*c*, and stack the second chip 100*b* on the passive side B of the third chip 100*c*.

It is to be noted that, when the chip stacking structure 10 further includes a fourth chip 100*d*, after thinning processing is performed on the passive side B of the third chip 100*c*, the fourth chip 100*d* is stacked on the passive side B of the third chip 100*c*, the active side F of the fourth chip 100*d* faces the passive side B of the third chip 100*c*, and thinning processing is performed on a passive side B of the fourth chip 100*d*. When the chip stacking structure 10 further includes a fifth chip 100*e*, thinning processing is performed on the passive side B of the fourth chip 100*d*, the fifth chip 100*e* is stacked on the passive side B of the fourth chip 100*d*, the active side F of the fifth chip 100*e* faces the passive side B of the fourth chip 100*d*, and thinning processing is performed on a passive side B of the fifth chip 100*e*. The rest may be deduced by analogy, and details are not described herein again. Finally, the second chip 100*b* is stacked.

S28: Perform thinning processing on the passive side B of the first chip 100*a*.

S29: Form a plurality of first via holes 104 on a side of the first chip 100*a*, fill the first via holes 104 with a conductive material, where each first via hole 104 is electrically connected to one first redistribution layer 101.

It is to be noted that, the plurality of first via holes 104 are formed on the side of the first chip 100*a*. In addition to a first chip 100*a* in a stacking direction, for another chip 100, when the first via hole 104 is manufactured, the first via hole 104 is penetrated from the active side F of the chip 100 to a passive side B of the chip 100. Therefore, such a drilling manner may also be referred to as a front-side drilling manner, that is, a plurality of first via holes 104 are formed in the front-side drilling manner.

S30: Form, in the stacking direction, a second redistribution layer 102 on a side of the passive side B of the first chip 100*a*.

S31: Form a micro bump 11 electrically connected to the second redistribution layer 102 on a side of the second redistribution layer 102 away from the first chip 100*a*.

It is to be noted that, this step is an optional step, for example, this step may also be omitted in some embodiments.

S32: Perform thinning processing on the passive side B of the second chip 100b.

For a method for performing thinning processing on the passive side B of the third chip 100c in step S27 and a method for performing thinning processing on the passive side B of the second chip 100b in step S32, refer to the foregoing embodiments. Details are not described herein again. In another optional embodiment, for example, manufacturing of the chip stacking structure 10 shown in FIG. 5b specifically includes the following steps.

S40: As shown in FIG. 15, stack the first chip 100a on a carrier 40. A first dielectric layer 103 is formed between the carrier 40 and the first redistribution layer 101 of the first chip 100a.

The first dielectric layer 103 may be formed on the side of the first redistribution layer 101 of the first chip 100a away from the first chip 100a. Alternatively, the first dielectric layer 103 may be formed on a side of the carrier 40 facing the first chip 100a. FIG. 15 is illustrated by using an example in which the first dielectric layer 103 is formed on the side of the carrier 40 facing the first chip 100a.

In some embodiments, the carrier 40 is a carrier chip. In other embodiments, the carrier 40 is a carrier substrate. A material of the carrier substrate may be one or more of glass, silicon oxide, silicon nitride, and silicon oxynitride.

When the carrier 40 is a carrier chip and the first dielectric layer 103 is formed on the side of the carrier 40 facing the first chip 100a, the first dielectric layer 103 may be formed on an active side F side of a carrier chip 100.

Based on this, the first chip 100a and the carrier 40 may be connected together by using a binder, or may be connected together in a fusion bonding manner. When the first chip 100a and the carrier 40 are connected together in the fusion bonding manner, organic contamination can be avoided. When the first chip 100a is a wafer, a problem such as wafer warpage can be avoided, thereby ensuring process reliability.

S41: Perform thinning processing on the passive side B of the first chip 100a, and stack the second chip 100b on the passive side B of the first chip 100a, where the active side F of the second chip 100b faces the passive side B of the first chip 100a.

The first chip 100a and the second chip 100b may be connected together by using a binder, or may be connected together in a fusion bonding manner.

Figure 16:
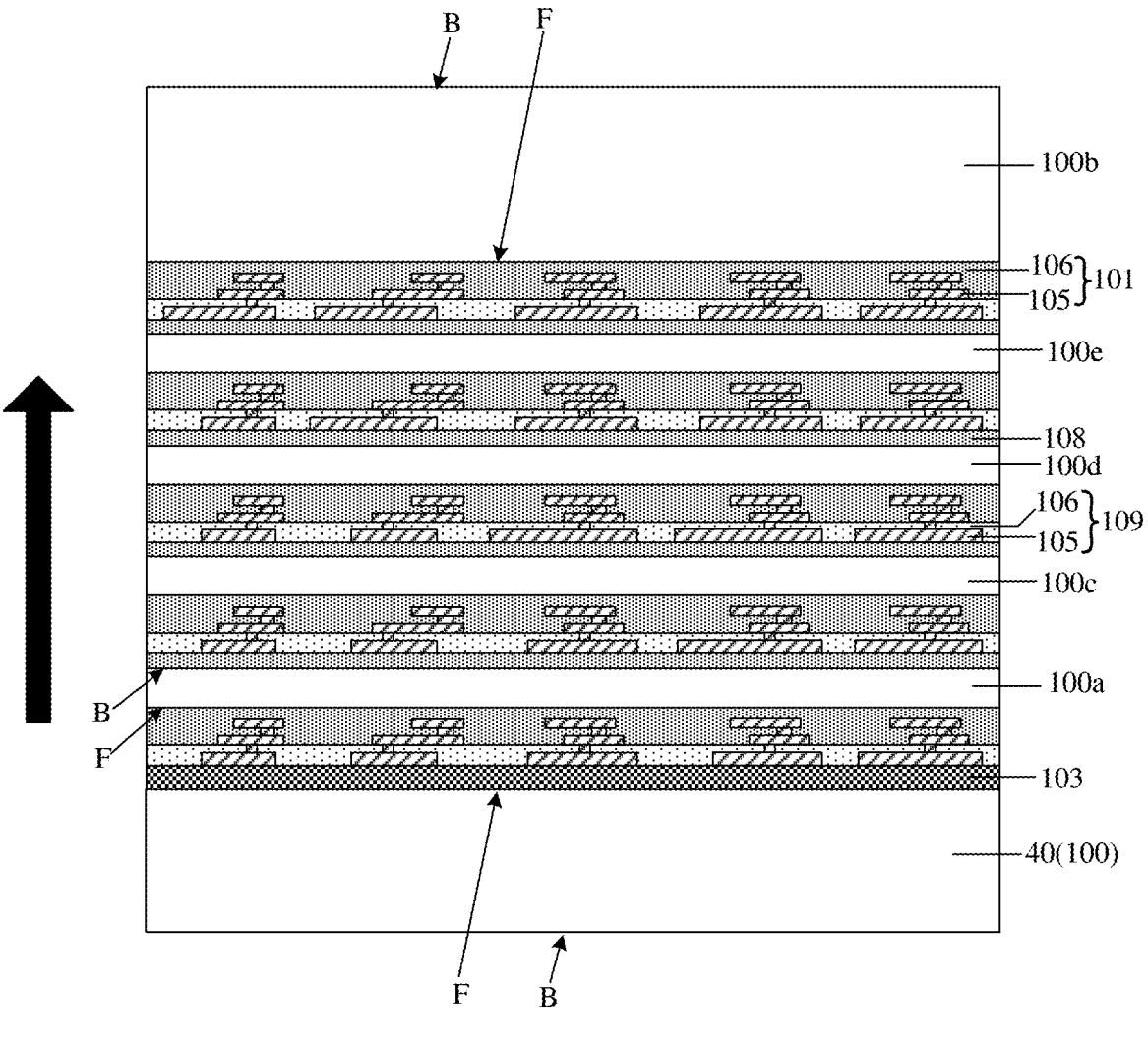
FIG. 16 is a schematic structural diagram 10 in a process of a chip stacking structure manufacturing method according to an embodiment of this disclosure.

It is to be noted that, after thinning processing is performed on the passive side B of the first chip 100a, as shown in FIG. 16, when the chip stacking structure 10 further includes a third chip 100c, the third chip 100c is stacked on the first chip 100a, the active side F of the third chip 100c faces the passive side B of the first chip 100a, and thinning processing is performed on a passive side B of the third chip 100c. When the chip stacking structure 10 further includes a fourth chip 100d, the fourth chip 100d is stacked on the passive side B of the third chip 100c, the active side F of the fourth chip 100d faces the passive side B of the third chip 100c, and thinning processing is performed on a passive side B of the fourth chip 100d. When the chip stacking structure 10 further includes a fifth chip 100e, the fifth chip 100e is stacked on the passive side B of the fourth chip 100d, the active side F of the fifth chip 100e faces the passive side B of the fourth chip 100d, and thinning processing is performed on a passive side B of the fifth chip 100e. The rest may be deduced by analogy, and details are not described herein again. Finally, the second chip 100b is stacked.

In some embodiments, after thinning processing is performed on the passive side B of the first chip 100a, and before the second chip 100b is stacked on the passive side B of the first chip 100a, the chip stacking structure 10 manufacturing method further includes: forming a third dielectric layer 108 on a side of the passive side B of the first chip 100a.

Because the third dielectric layer 108 is formed on the side of the passive side of the first chip 100a before the second chip 100b is stacked on the passive side B of the first chip 100a, when the second chip 100b is stacked on the passive side B of the first chip 100a, the first chip 100a and the second chip 100b may be stacked together in the fusion bonding manner. Compared with connecting by using the adhesive, the fusion bonding manner can avoid organic contamination (where the binder is usually an organic substance). In addition, when first chip 100a and the second chip 100b are wafers, a problem such as wafer warpage can be avoided, thereby ensuring process reliability.

Figure 17:
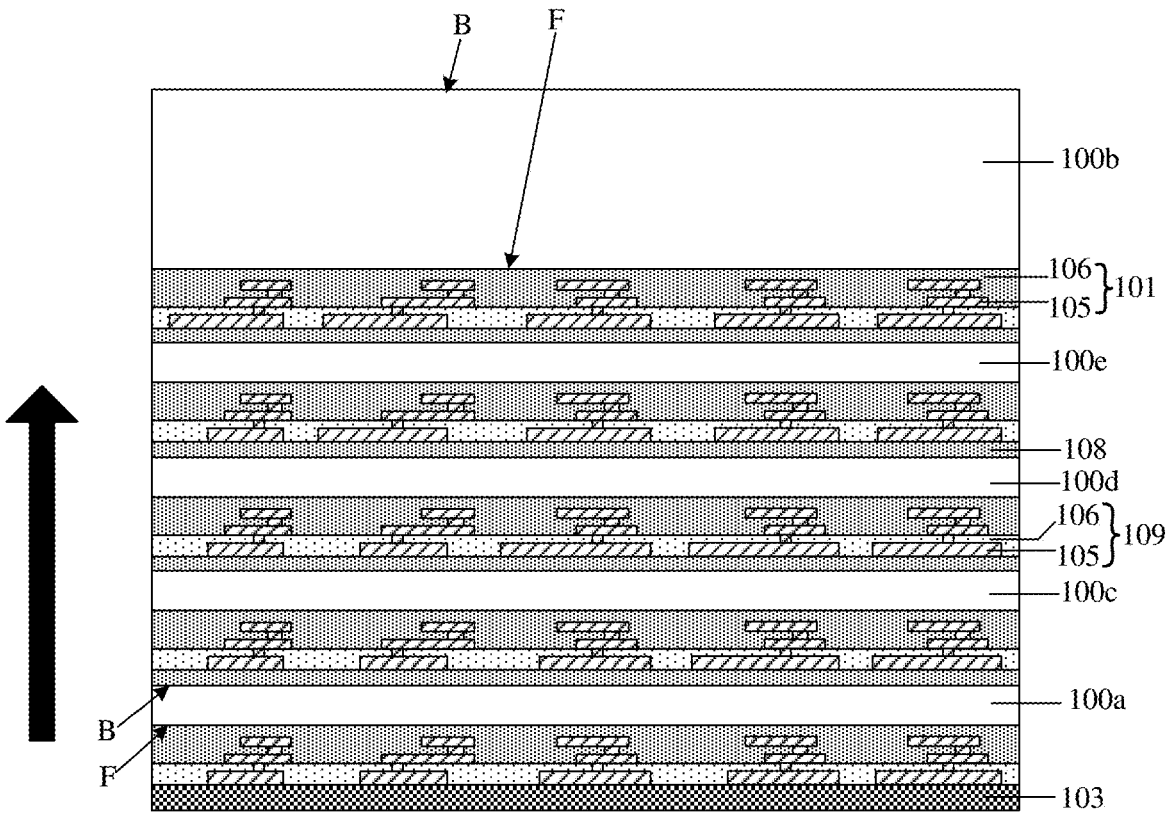
FIG. 17 is a schematic structural diagram 11 in a process of a chip stacking structure manufacturing method according to an embodiment of this disclosure.

S42: As shown in FIG. 17, remove the carrier 40.

The carrier 40 may be removed in a cutting manner, or the carrier 40 may be removed in a physical grinding manner and a chemical mechanical polishing manner.

Figure 18:
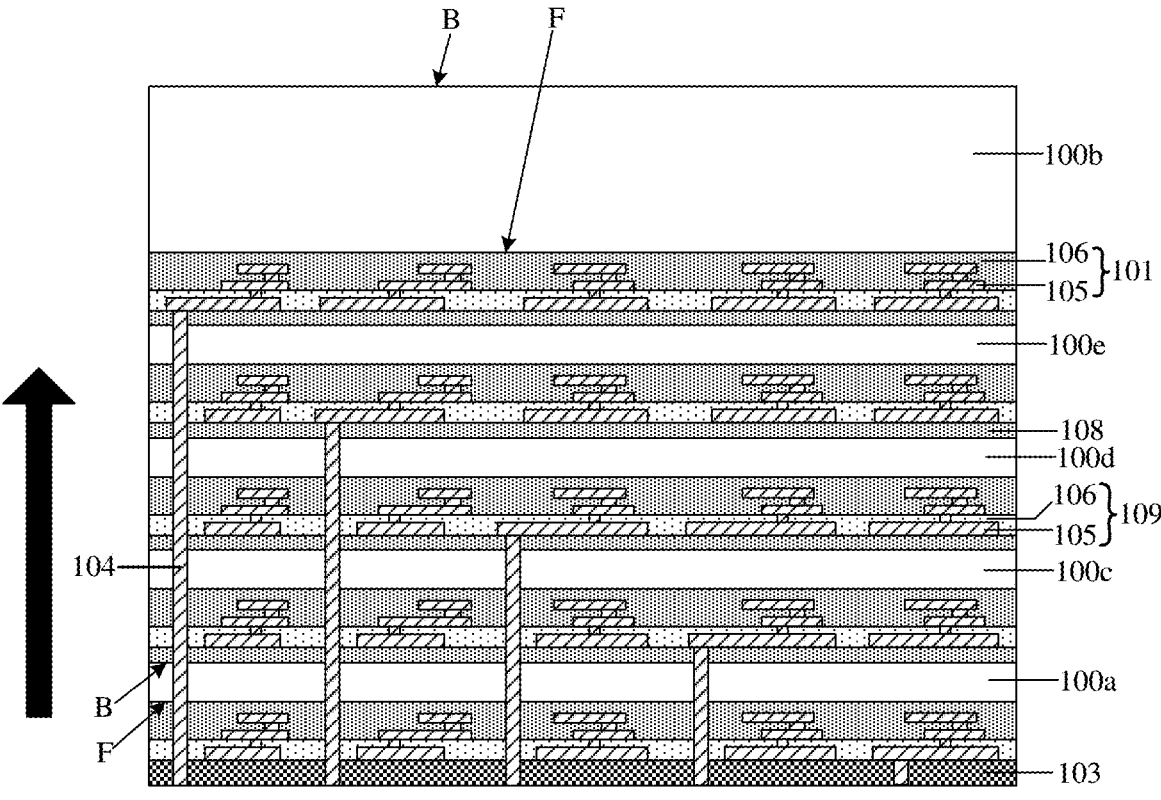
FIG. 18 is a schematic structural diagram 12 in a process of a chip stacking structure manufacturing method according to an embodiment of this disclosure.

S43: As shown in FIG. 18, form a plurality of first via holes 104 on a side of the first dielectric layer 103, fill the first via holes 104 with a conductive material, where each first via hole 104 is electrically connected to one first redistribution layer 101.

It is to be noted that, when the plurality of first via holes 104 are formed on the side of the first dielectric layer 103, for any chip 100, when the first via hole 104 is manufactured, the first via hole 104 is penetrated from the active side F of the chip 100 to a passive side of the chip 100. Therefore, such a drilling manner may also be referred to as a front-side drilling manner, that is, a plurality of first via holes 104 are formed in the front-side drilling manner.

For a specific implementation of this step, refer to step S1l described above.

When a third redistribution layer 109 located on a side of the first redistribution layer 101 away from a chip 100 electrically connected to the first redistribution layer 101 is further formed on the active side F of each chip 100, each first via hole 104 is electrically connected to one third redistribution layer 109.

Figure 19:
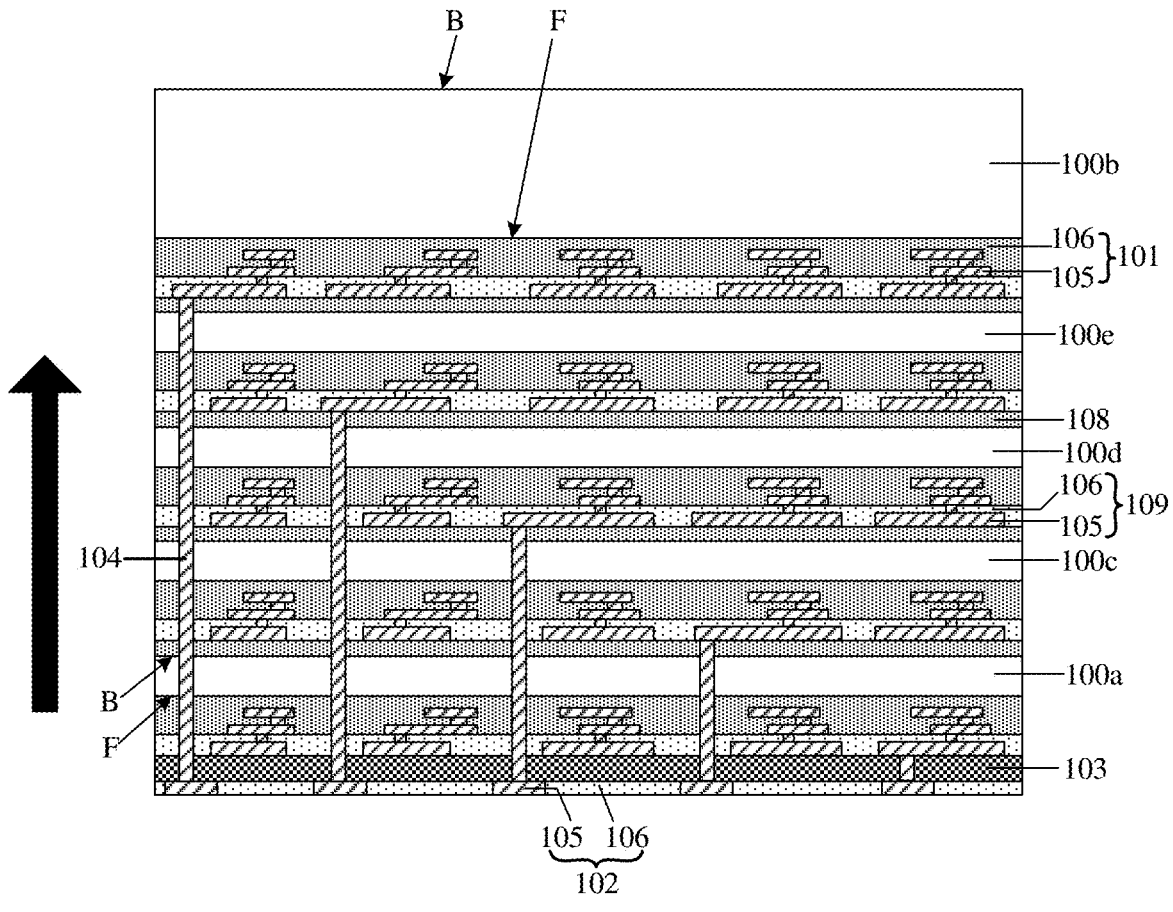
FIG. 19 is a schematic structural diagram 13 in a process of a chip stacking structure manufacturing method according to an embodiment of this disclosure.

S43: As shown in FIG. 19, form a second redistribution layer 102 on a side of the first dielectric layer 103 away from the first chip 100a.

For a structure of the second redistribution layer 102, refer to the foregoing embodiment, and details are not described herein again.

Figure 20:
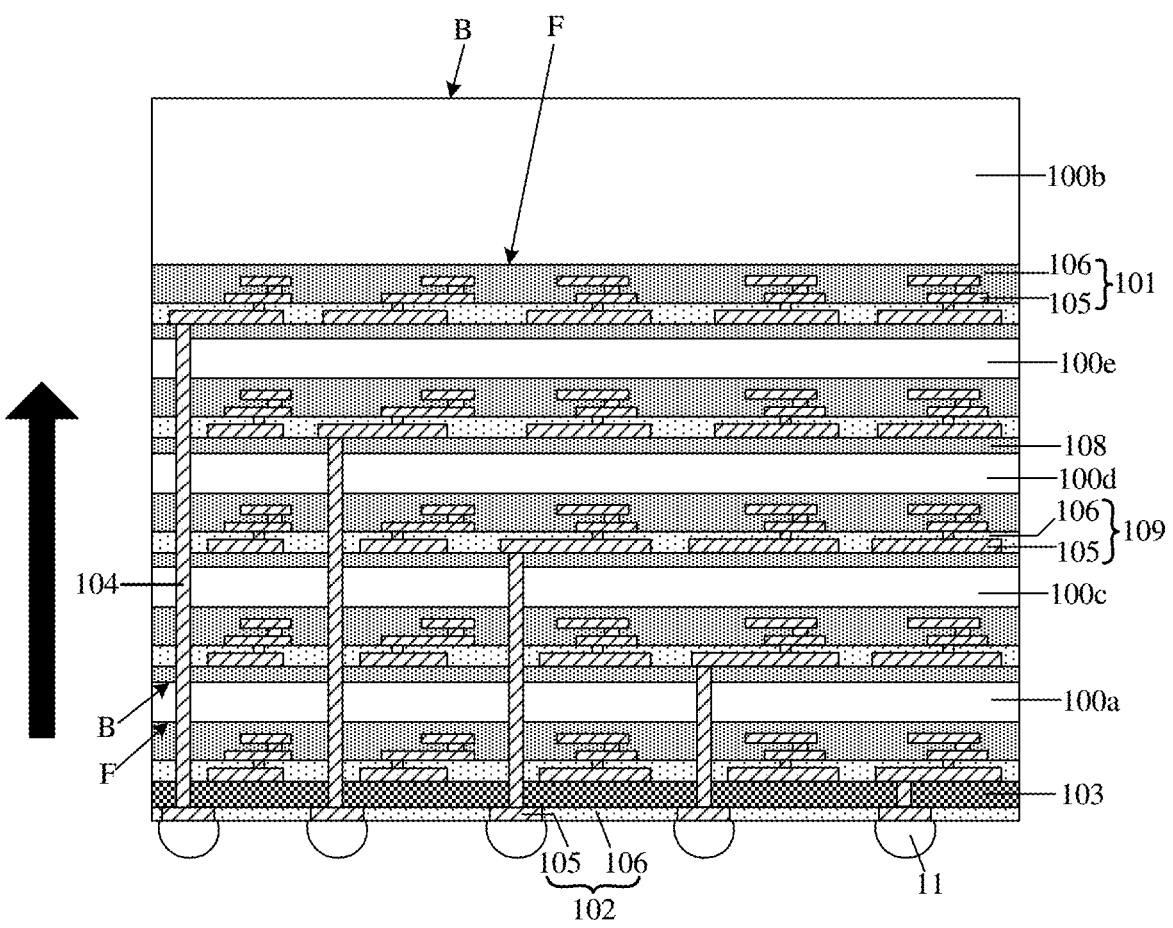
FIG. 20 is a schematic structural diagram 14 in a process of a chip stacking structure manufacturing method according to an embodiment of this disclosure.

S44: As shown in FIG. 20, form a micro bump 11 electrically connected to the second redistribution layer 102 on a side of the second redistribution layer 102 away from the first dielectric layer 103.

It is to be noted that, this step is an optional step, for example, this step may also be omitted in some embodiments.

S45: As shown in FIG. 5b, perform thinning processing on the passive side B of the second chip 100b.

The passive side B of the second chip 100b may be thinned to a desired thickness in a physical grinding manner and/or a chemical mechanical polishing manner.

When at least one of the plurality of chips is a wafer, the manufacturing method further includes the following steps.

S46: Cut a wafer to form a chip stacking structure 10 as shown in FIG. 5b.

It is to be noted that, an order of step S45 and step S46 may be exchanged. For example, step S45 is performed first, and then step S46 is performed. In another example, step S46 is performed first, and then step S45 is performed.

Step S46 is an optional step, and this step may be omitted when the plurality of chips are all dies. When the carrier 40 is a carrier wafer, one carrier wafer is consumed when the chip stacking structure 10 is manufactured according to S40 to S46.

Based on the above, in some embodiments, the sequentially stacking a plurality of chips 100 includes: stacking an $m^{th}$ chip 100m on an $n^{th}$ chip 100n, and performing thinning processing on a passive side B of the $m^{th}$ chip 100m, where both m and n are positive integers; and the active side F of the $m^{th}$ chip faces the $n^{th}$ chip; and forming a second via hole 112, and filling the second via hole 112 with a conductive material, where the first redistribution layer 101 of the $m^{th}$ chip 100m and the first redistribution layer 101 of the $n^{th}$ chip 100n are electrically connected through the second via hole 112.

The $m^{th}$ chip 100m and the $n^{th}$ chip 100n may be adjacent, or may not be adjacent.

It is to be noted that, for a process of stacking the chips 100, refer to the foregoing description. Details are not described herein again.

The following describes a process of manufacturing the second via hole 112 by using an example in which the $m^{th}$ chip 100m is the fifth chip 100e and the $n^{th}$ chip 100n is the third chip 100c.

Figure 21:
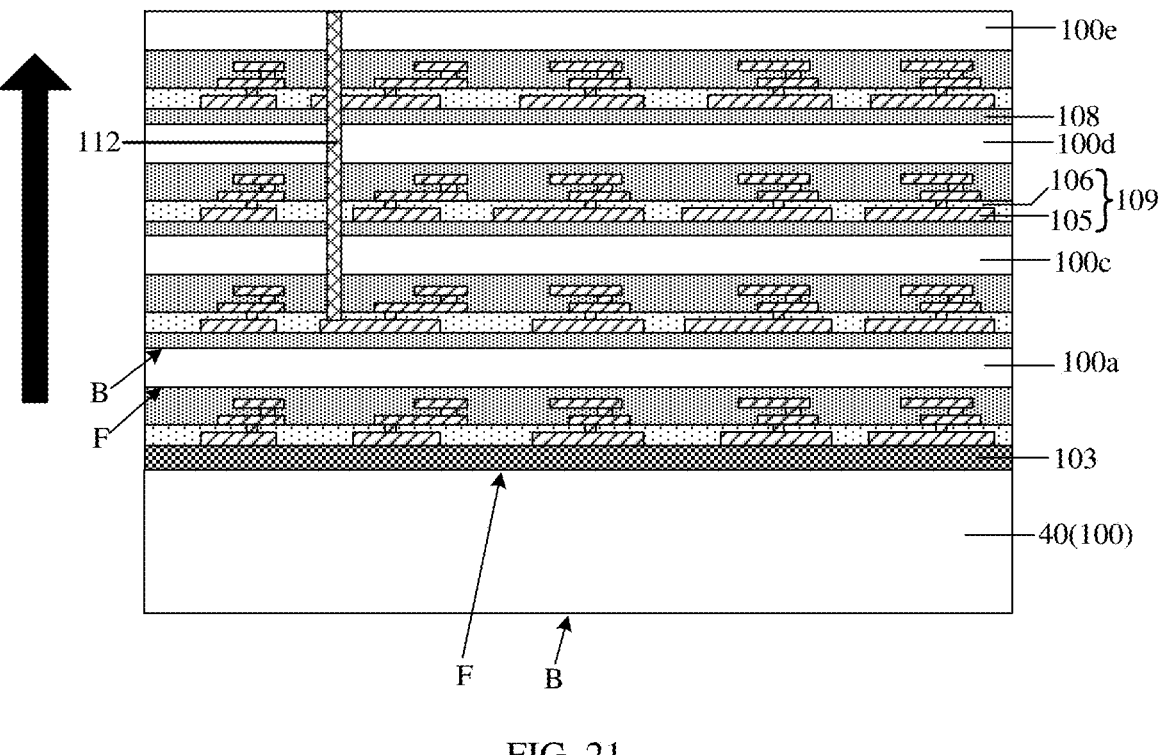
FIG. 21 is a schematic structural diagram 15 in a process of a chip stacking structure manufacturing method according to an embodiment of this disclosure.

As shown in FIG. 21, the third chip 100c is stacked on the first chip 100a, the active side F of the third chip 100c faces the passive side B of the first chip 100a, and thinning processing is performed on the passive side B of the third chip 100c. The fourth chip 100d is stacked on the third chip 100c, the active side F of the fourth chip 100d faces the passive side B of the third chip 100c, and thinning processing is performed on the passive side B of the fourth chip 100d. The fifth chip 100e is stacked on the fourth chip 100d, the active side F of the fifth chip 100e faces the passive side B of the fourth chip 100d, and thinning processing is performed on a passive side B of the fifth chip 100e. Next, a second via hole 112 is formed, and the second via hole 112 is filled with a conductive material. The second via hole 112 is in contact with both the first redistribution layer 101 of the third chip 100c and the first redistribution layer 101 of the fifth chip 100e. Therefore, the first redistribution layer 101 of the fifth chip 100e and the first redistribution layer 101 of the third chip 100c may be electrically connected to each other through the second via hole 112, to finally implement an electrical connection between the third chip 100c and the fifth chip 100e. In the conventional technology, when the $m^{th}$ chip 100m and the $n^{th}$ chip 100n are not adjacent, to implement an electrical connection between the $m^{th}$ chip 100m and the $n^{th}$ chip 100n, a plurality of via holes need to be formed. As a result, a process of manufacturing the chip stacking structure 10 is complex. However, in embodiments of this disclosure, the first redistribution layer 101 of the $m^{th}$ chip 100m is electrically connected to the first redistribution layer 101 of the $n^{th}$ chip 100n through the second via hole 112, and one second via hole 112 may be manufactured by using a one-time drilling process. Therefore, the process of manufacturing the chip stacking structure 10 can be simplified.

The following provides a specific embodiment to describe the chip stacking structure 10 and a manufacturing method thereof by using an example.

Figure 22:
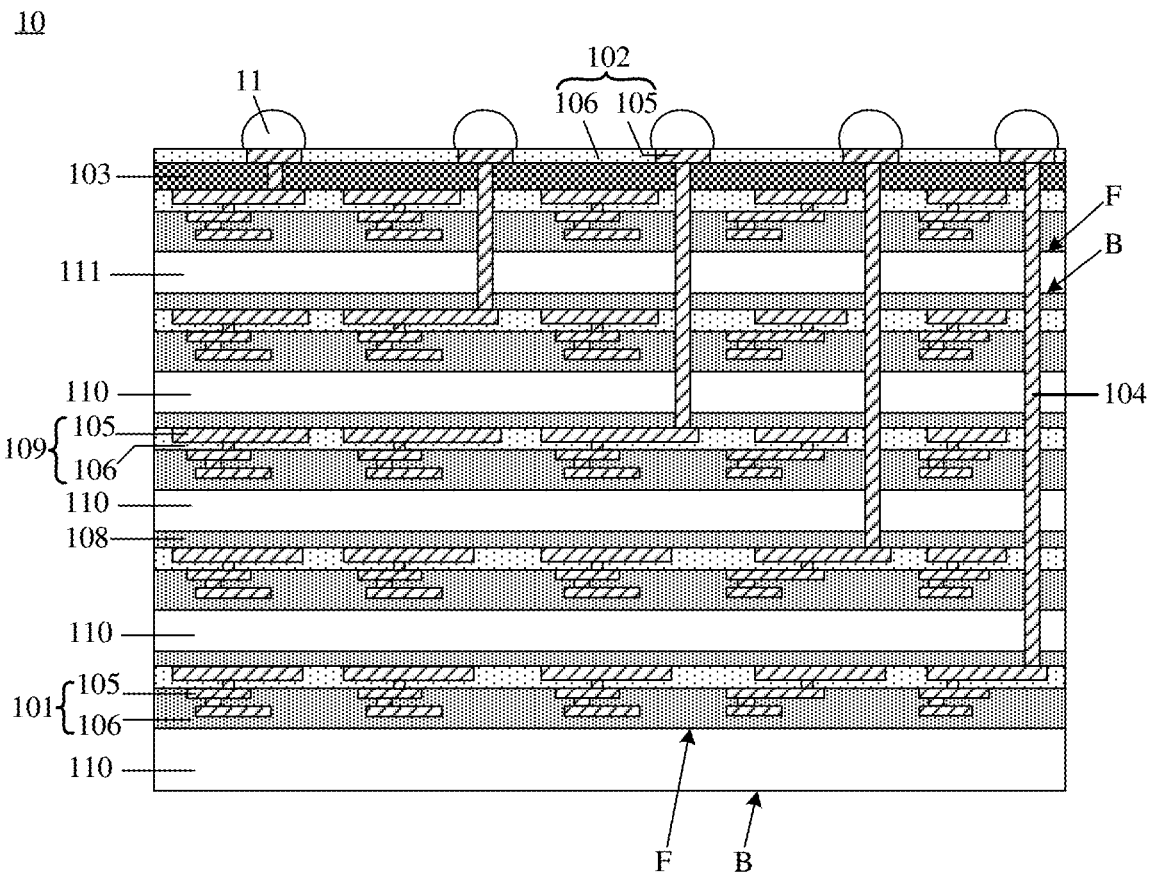
FIG. 22 is a schematic diagram of a structure of a chip stacking structure according to still yet another embodiment of this disclosure.

As shown in FIG. 22, the chip stacking structure 10 includes one or more memory chips 110 and one or more logic chips 111 that are sequentially stacked. In FIG. 22, four memory chips 110 and one logic chip 111 that are sequentially stacked are used as an example, a first redistribution layer 101 and a third redistribution layer 109 are formed on an active side F of each logic chip 111 and memory chip 110. The first redistribution layer 101 is in contact with and electrically connected to the logic chip 111 and the memory chips 110, and the first redistribution layer 101 is electrically connected to the third redistribution layer 109. The chip stacking structure 10 further includes a third dielectric layer 108 arranged between a first redistribution layer 101 and a passive side B of a chip 100 adjacent to the first redistribution layer 101, a plurality of first via holes 104 electrically connected to each third redistribution layer 109, a first dielectric layer 103 arranged on the active side F of the logic chip 111, a second redistribution layer 102 arranged on a side of the first dielectric layer 103 away from the logic chip 111, and a micro bump 11 arranged on a side of the second redistribution layer 102 away from the first dielectric layer 103. The chip stacking structure 10 may be used to implement a high-bandwidth memory. As required, more memory chips 110 may be stacked to achieve higher bandwidth.

In the chip stacking structure 10 shown in FIG. 22, a plurality of first via holes 104 are formed by using a front-side drilling process. For any chip, during drilling, the first via hole 104 penetrate from an active side F to a passive side B. When the plurality of first via holes 104 are formed by using the front-side drilling process, one carrier wafer is consumed when the carrier 40 is a carrier wafer. In embodiments of this disclosure, each first via hole 104 is formed by using a one-time drilling process, and each logic chip 111 and memory chip 110 may be electrically connected to the second redistribution layer 102 through the first via hole 104. Therefore, the process of manufacturing the chip stacking structure 10 is simplified. Certainly, after the logic chip 111 and the memory chip 110 are stacked, the plurality of first via holes 104 may be formed by using a back-side drilling process, and a carrier wafer does not need to be consumed when the back-side drilling process is used.

According to another aspect of this disclosure, a non-transitory computer-readable storage medium for use with a computer is further provided. The computer has software for creating manufacturing of the chip stacking structure 10, and one or more computer-readable data structures are stored on the computer-readable storage medium. The one or more computer-readable data structures have control data, for example, photomask data, for manufacturing the chip stacking structure 10 provided in any one of the figures above.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. A chip stacking structure comprising:
   a plurality of chips, sequentially stacked and comprise a first chip and a second chip that are located on a first outermost side and a second outermost side of the plurality of chips, respectively, wherein the first and second outermost sides are located on opposite sides of the plurality of chips and a passive side of the first chip and a passive side of the second chip face a first outer side and a second outer side of the chip stacking structure, respectively;

a first redistribution layer, arranged on a side of an active side of each of the chips, wherein the first redistribution layer is in contact with and electrically connected to at least a corresponding one of the plurality of chips; and a second redistribution layer arranged on a side of the passive side of the first chip or a side of the passive side of the second chip, wherein the second redistribution layer is electrically connected to at least the first redistribution layer through a first via hole;

the chip stacking structure further comprises a third redistribution layer arranged on a side of the first redistribution layer away from one of the plurality of chips that is electrically connected to the first redistribution layer;

the third redistribution layer is electrically connected to the first redistribution layer, and the second redistribution layer is electrically connected to the third redistribution layer through the first via hole;

a thickness of a metal line layer in the third redistribution layer is greater than a thickness of a metal line layer in the first redistribution layer; and the second redistribution layer is electrically connected to the third redistribution layer through the first via hole by the metal line layer in the third redistribution layer being electrically connected to a metal line layer in the second redistribution layer through the first via hole.

2. The chip stacking structure according to claim 1, wherein the plurality of chips further comprise a third chip arranged between the first chip and the second chip, wherein the active side of the first chip is opposite to an active side of the third chip, and an active side of the second chip faces a passive side of the third chip; and the chip stacking structure further comprises a dielectric layer arranged between the active side of the first chip and the active side of the third chip.

3. The chip stacking structure according to claim 1, wherein the plurality of chips further comprises a third chip arranged between the first chip and the second chip and the second redistribution layer is located on the active side of the first chip; and an active side of the second chip faces the passive side of the third chip.

4. The chip stacking structure according to claim 1, wherein the chip stacking structure further comprises a dielectric layer arranged between the first redistribution layer and a passive side of one of the plurality of chips that is adjacent to the first redistribution layer.

5. The chip stacking structure according to claim 1, wherein the chip stacking structure further comprises a micro bump that is arranged on a side of the second redistribution layer away from the plurality of chips and that is electrically connected to the second redistribution layer.

6. The chip stacking structure according to claim 1, wherein the chip stacking structure further comprises a second via hole and the third redistribution layer in contact with and electrically connected to a corresponding to one of the plurality of chips; and any two of the first, second and third redistribution layers are electrically connected through the second via hole.

7. The chip stacking structure according to claim 1, wherein the third redistribution layer is electrically connectable to the first redistribution layer and/or the second redistribution layer through a second via hole, which is a different via hole from the first via hole.

8. A chip stacking structure, comprising:

a plurality of chips, sequentially stacked and comprising a first chip and a second chip that are located on a first outermost side and a second outermost side of the plurality of chips, respectively, wherein the first and second outermost sides are located on opposite sides of the plurality of chips and, a passive side of the second chip faces a first outer side of the chip stacking structure, and an active side of the first chip faces a second outer side of the chip stacking structure;

a first redistribution layer, arranged on a side of an active side of the second chip, wherein the first redistribution layer is in contact with and electrically connected to a corresponding one of the plurality of chips;

a first dielectric layer; and a second redistribution layer, arranged on the active side of the first chip, wherein the first dielectric layer is located between the first redistribution layer and the second redistribution layer, and the second redistribution layer is electrically connected to at least the first redistribution layer through a first via hole;

the chip stacking structure further comprises a third redistribution layer arranged on a side of the first redistribution layer away from one of the plurality of chips that is electrically connected to the first redistribution layer;

the third redistribution layer is electrically connected to the first redistribution layer, and the second redistribution layer is electrically connected to the third redistribution layer through the first via hole;

a thickness of a metal line layer in the third redistribution layer is greater than a thickness of a metal line layer in the first redistribution layer; and the second redistribution layer is electrically connected to the third redistribution layer through the first via hole by the metal line layer in the third redistribution layer being electrically connected to a metal line layer in the second redistribution layer through the first via hole.

9. The chip stacking structure according to claim 8, wherein the second redistribution layer is located on the side of the active side of the first chip or the side of the active side of the second chip; and the plurality of chips further comprise a third chip arranged between the first chip and the second chip, wherein the active side of the first chip is opposite to an active side of the third chip, and an active side of the second chip faces a passive side of the third chip.

10. The chip stacking structure according to claim 8, wherein the second redistribution layer is located on the active side of the first chip; and an active side of the second chip faces the passive side of the first chip.

11. The chip stacking structure according to claim 8, wherein the chip stacking structure further comprises another dielectric layer arranged between the first redistribution layer and a passive side of on one of the plurality of chips adjacent to the first redistribution layer.

12. The chip stacking structure according to claim 8, wherein the chip stacking structure further comprises a micro bump that is arranged on a side of the second redistribution layer away from the plurality of chips and that is electrically connected to the second redistribution layer.

13. The chip stacking structure according to claim 8, wherein the chip stacking structure further comprises a second via hole and the third redistribution layer in contact with and electrically connected to a corresponding to one of the plurality of chips; and any two of the first, second and third redistribution layers are electrically connected through the second via hole.

14. The chip stacking structure according to claim 8, wherein the third redistribution layer is electrically connectable to the first redistribution layer and/or the second redistribution layer through a second via hole, which is a different via hole from the first via hole.

15. A chip stacking structure manufacturing method comprising:

sequentially stacking a plurality of chips, wherein a first redistribution layer is formed on a side of an active side of each chip, and the first redistribution layer is in contact with and electrically connected to at least a corresponding one of the plurality of chips; and the plurality of chips comprise a first chip and a second chip that are respectively located on a first outermost side and a second outermost side of the plurality of chips that are sequentially stacked, the first and second outermost sides being located on opposite sides of the plurality of chips;

forming a plurality of via holes, and filling the via holes with a conductive material; and forming a second redistribution layer on a side of a passive side of the first chip or a side of a passive side of the second chip, wherein both the passive side of the first chip and the passive side of the second chip face a first outer side and a second outer side of the plurality of chips that are sequentially stacked, and wherein the second redistribution layer is electrically connected to at least the first redistribution layer through at least one of the via holes;

the chip stacking structure further comprises a third redistribution layer arranged on a side of the first redistribution layer away from one of the plurality of chips that is electrically connected to the first redistribution layer;

the third redistribution layer is electrically connected to the first redistribution layer, and the second redistribution layer is electrically connected to the third redistribution layer through the least one of the via holes;

a thickness of a metal line layer in the third redistribution layer is greater than a thickness of a metal line layer in the first redistribution layer; and the second redistribution layer is electrically connected to the third redistribution layer through the least one of the via holes by the metal line layer in the third redistribution layer being electrically connected to a metal line layer in the second redistribution layer through the least one of the via holes.

16. The chip stacking structure manufacturing method according to claim 15, wherein the sequentially stacking of the plurality of chips comprises:

stacking a third chip on the first chip, wherein an active side of the third chip faces the active side of the first chip; and a dielectric layer is formed between the first redistribution layer of the first chip and the first redistribution layer of the third chip; and performing thinning processing on a passive side of the third chip, stacking the second chip on the passive side of the third chip, and performing thinning processing on the passive side of the first chip or the passive side of the second chip, wherein an active side of the second chip faces the passive side of the third chip.

17. The chip stacking structure manufacturing method according to claim 16, wherein:

the thinning processing is performed on the passive side of the first chip, and the forming of the second redistribution layer on the side of the passive side of the first chip or the side of the passive side of the second chip comprises: forming the second redistribution layer on the side of the passive side of the first chip; or the thinning processing is performed on the passive side of the second chip, and the forming of the second redistribution layer on the side of the passive side of the first chip or the side of the passive side of the second chip comprises: forming the second redistribution layer on the side of the passive side of the second chip.

18. The chip stacking structure manufacturing method according to claim 17, wherein:

after the forming of the second redistribution layer on the side of the passive side of the first chip, the manufacturing method further comprises: performing thinning processing on the passive side of the second chip; or after the forming of the second redistribution layer on the side of the passive side of the second chip, the manufacturing method further comprises: performing thinning processing on the passive side of the first chip.

19. The chip stacking structure manufacturing method according to claim 18, wherein after the forming of the second redistribution layer on the side of the passive side of the first chip and before the performing of the thinning processing on the passive side of the second chip, or after the forming of the second redistribution layer on the side of the passive side of the second chip and before the performing of the thinning processing on the passive side of the first chip, the manufacturing method further comprises:

forming a micro bump that is electrically connected to the second redistribution layer on a side of the second redistribution layer away from the plurality of the chips.

20. The chip stacking structure manufacturing method according to claim 16, wherein after the performing of the thinning processing on the passive side of the third chip and before the stacking the second chip on the passive side of the third chip, the manufacturing method further comprises:

forming a dielectric layer on a side of the passive side of the third chip.

* * * * *